US008797065B2

(12) United States Patent
Tanaka

(10) Patent No.: US 8,797,065 B2
(45) Date of Patent: *Aug. 5, 2014

(54) SELECTOR CIRCUIT AND PROCESSOR SYSTEM

(71) Applicant: Fujitsu Limited, Kawasaki (JP)

(72) Inventor: Tomohiro Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/721,226

(22) Filed: Dec. 20, 2012

(65) Prior Publication Data
US 2013/0106492 A1 May 2, 2013

Related U.S. Application Data

(63) Continuation of application No. 13/238,095, filed on Sep. 21, 2011, now Pat. No. 8,373,442.

(30) Foreign Application Priority Data

Oct. 25, 2010 (JP) ................................. 2010-238521

(51) Int. Cl.
G11C 8/00 (2006.01)
H03K 19/084 (2006.01)
G11C 8/08 (2006.01)
G11C 8/10 (2006.01)
H03K 19/096 (2006.01)

(52) U.S. Cl.
CPC .. *G11C 8/08* (2013.01); *G11C 8/10* (2013.01); *H03K 19/096* (2013.01); *H03K 19/0963* (2013.01)
USPC ............... 326/106; 326/93; 326/95; 326/105; 326/108

(58) Field of Classification Search
None
See application file for complete search history.

(56) References Cited

U.S. PATENT DOCUMENTS 5,572,151 A 11/1996 Hanawa et al.
5,646,558 A 7/1997 Jamshidi
(Continued)

FOREIGN PATENT DOCUMENTS

JP 06-177751 A 6/1994
JP 10-302479 A 11/1998
JP 11-261406 A 9/1999
JP 2001-325050 A 11/2001

OTHER PUBLICATIONS

USPTO, (TRAN) Notice of Allowance and Fee Due, Sep. 24, 2012, in parent U.S. Appl. No. 13/238,095 [allowed].

*Primary Examiner* — Anh Tran
(74) *Attorney, Agent, or Firm* — Fujitsu Patent Center

(57) ABSTRACT

A selector circuit includes a plurality of first selection circuits each configured to select one of plural input signals on the basis of a first selection control signal and to output a first output signal and a second selection circuit configured to select one of the first output signals on the basis of a second selection control signal. Each of the first selection circuits includes a charging circuit configured to charge a first node by electrically connecting the first node to a first voltage in a first period, and a discharge control circuit configured to control, on the basis of the first selection control signal, the input signals and the second selection control signal, whether to discharge the charged first node by electrically connecting the first node to a second voltage source having a potential lower than the first voltage source in a second period following the first period.

20 Claims, 16 Drawing Sheets

(56) References Cited

U.S. PATENT DOCUMENTS

| | | |
|---|---|---|
| 6,046,606 A | 4/2000 | Chu et al. |
| 6,049,231 A | 4/2000 | Bosshart |
| 6,061,286 A | 5/2000 | Baroni et al. |
| 8,373,442 B2 * | 2/2013 | Tanaka .......................... 326/106 |

* cited by examiner

SELECTOR CIRCUIT AND PROCESSOR SYSTEM

CROSS-REFERENCE TO RELATED APPLICATION

This application is a Continuation of application Ser. No. 13/238,095, filed Sep. 21, 2011, which is based upon and claims the benefit of priority of the prior Japanese Patent Applications No. 2010-238521, filed on Oct. 25, 2010, the entire contents of which are incorporated herein by reference.

FIELD

The embodiments disclosed herein relate to a selector circuit and a processor system.

BACKGROUND

At present, in each of many integrated circuits, a selector circuit is widely used so as to realize a function of selecting one signal from among a plurality of input signals.

FIG. 1 is a diagram illustrating an example of the selector circuit. In FIG. 1, a signal line indicated by a heavy line indicates that the signal line includes a plurality of signal lines. In the other figures, heavy lines are also defined in the same way as in FIG. 1.

A selector circuit 100 illustrated in FIG. 1 includes selection circuits 101 to 104 located at a previous stage, a selection circuit 105 located at a subsequent stage, and a discharge transistor 106, and selects one signal from among 16 input signals IN1 to IN16, and output the signal as an output signal OUT.

Each of the selection circuits 101 to 104 receives four corresponding input signals from among the 16 input signals IN1 to IN16. In addition, each of the selection circuits 101 to 104 receives common selection control signals SEL_L1 to SEL_L4 and a timing control signal P/E. Each of the selection circuits 101 to 104 selects and outputs one signal from among the four received input signals, on the basis of the selection control signal SEL_L1 to SEL_L4.

The selection circuit 105 receives four output signals OUT1 to OUT4 of the selection circuits 101 to 104, and receives selection control signals SEL_H1 to SEL_H4. On the basis of the selection control signals SEL_H1 to SEL_H4, the selection circuit 105 selects one signal from among the four received output signals OUT1 to OUT4, and outputs the selected signal as an output signal OUT.

Here, the circuit operations of the selection circuits 101 to 104 will be described in accordance with a timing chart illustrated in FIG. 2.

In addition, in the present specification and the figures, it is assumed that, form among levels of a digital signal propagating through a circuit, a higher level is indicated by "H" or "1", and a lower level is indicated by "L" or "0". An H level and "1" have a same meaning, and an L level and "0" have a same meaning.

In addition, in this chart, for example, a notation "SEL_H1, 2,3,4" indicates a set of four signals SEL_H1 to SEL_H4. In addition, a notation "1000" indicates that the SEL_H1 is "1" (H level), the SEL_H2 is "0" (L level), the SEL_H3 is "0" (L level), and the SEL_H4 is "0" (L level). The same notation system is also adopted for the other signals. In addition, the same notation system is also adopted in the other figures.

In the example illustrated in FIG. 2, the selection control signal SEL_H1 is set to "1" (H level), and the remaining SEL_H2 to SEL_H4 are set to "0" (L level). Accordingly, the output signal OUT1 of the selection circuit 101 is selected in the selection circuit 105, and is output as the output signal OUT.

First, at a time t1, the timing control signal P/E is set to an L level, and a precharge period PC starts. In the precharge period PC, in the selection circuit 101, a precharge-use transistor in a charging circuit 107 is turned on. Accordingly, a voltage source VDD and a node N101 are electrically connected to each other, and the node N101 is charged to an H level. The H level of the node N101 is held by the latching function of an output circuit 108. At this time, since the discharge transistor 106 is turned off, the node N101 and ground GND are electrically disconnected from each other.

Next, at a time t2, the timing control signal P/E is set to an H level, and an evaluation period EV starts. In the evaluation period EV, the precharge-use transistor of the charging circuit 107 is turned off. Accordingly, in the selection circuit 101, the node N101 is disconnected from the voltage source VDD. At this time, the discharge transistor 106 is turned on. A discharge control circuit 110 that controls whether or not the node N101 is to be discharged is provided between the node N101 and the transistor 106, and controls whether or not the node N101 and the ground GND are to be electrically connected to each other through the discharge transistor 106.

In the example illustrated in FIG. 2, the selection control signal SEL_L1 is set to "1", and the remaining SEL_L2 to SEL_L4 are set to "0". In this case, in the discharge control circuit 110, only a transistor, into the gate of which the selection control signal SEL_L1 is input, is turned on, and transistors, into the gates of which the three remaining selection control signals SEL_L2 to SEL_L4 are input, are turned off. Accordingly, the input signal IN1 corresponding to the selection control signal SEL_L1 is selected.

At this time, since the input signal IN1 indicates "1" (H level), the transistor into the gate of which the input signal IN1 is input is turned on. Accordingly, since the node N101 and the ground GND are electrically connected to each other, the node N101 is discharged to an L level through the discharge control circuit 110 and the discharge-use transistor 106.

The output circuit 108 inverts the L level of the node N101 using an inverter 109, and outputs a signal of an H level, as the output signal OUT1. Namely, in the selection circuit 101, the output signal OUT1 is output that has the same level as the H level ("1") of the input signal IN1.

The selection circuit 105 selects the output signal OUT1 of the selection circuit 101. Receiving the output signal OUT1 of an H level, the selection circuit 105 outputs the output signal OUT of an H level.

In addition, a technique has been known in which, after charging a signal line to an H level, it is determined, on the basis of the level of an input signal, whether or not the signal line is to be discharged, and thereby outputting a signal of a desired level.

Examples of such a technique are disclosed in Japanese Laid-open Patent Publication No. 06-177751, Japanese Laid-open Patent Publication No. 2001-325050, and Japanese Laid-open Patent Publication No. 10-302479.

However, in the selector circuit illustrated in FIG. 1, in the selection circuits 102 to 104 located at the previous stage, which output the output signals OUT2 to OUT4 that are not selected by the selector circuit 105 located at the subsequent stage, the same circuit operations as that of the selection circuit 101 are also performed. In the same way as the node N101 in the selection circuit 101, in the selection circuits 102 to 104, charge-discharge cycles are also repeatedly executed for nodes N102 to N104, and operations are also repeatedly performed in which output signals having levels corresponding to the levels of the input signals are generated. Therefore, there has been a problem that useless discharge is repeated, an unwanted consumption current occurs, and hence a large amount of electric power is wasted.

In the example illustrated in FIG. 2, even though the output signals OUT2 to OUT4 of the selection circuits 102 to 104 located at the previous stage are not selected by the selection circuit 105 located at the subsequent stage, in the selection circuits 102 to 104, the nodes N102 to N104 are also charged to H levels in the precharge period PC, and the nodes N102 to N104 are discharged to L levels by the H levels ("1") of the selected input signals IN5, IN9, and IN13 in the evaluation period EV. In addition, a charge operation in the precharge period and a discharge operation in the evaluation period are repeated. As the result of unwanted charge and discharge repeatedly performed for the nodes N102 to N104, an unwanted consumption current occurs.

SUMMARY

According to an aspect of the embodiments, a selector circuit includes a plurality of first selection circuits, each of the plurality of first selection circuits being configured to select one of a plurality of input signals on the basis of a first selection control signal and to output a first output signal corresponding to the selected input signal, and a second selection circuit configured to select one of the first output signals outputted from the plurality of first selection circuits respectively on the basis of a second selection control signal and to output a second output signal corresponding to the selected first output signal. Each of the plurality of first selection circuits includes a first node capable of being charged and discharged, a charging circuit configured to be provided between a first voltage source and the first node and to charge the first node by electrically connecting the first node to the first voltage in a first period, the first period being defined by a timing control signal, a discharge control circuit configured to be provided between the first node and a second voltage source having a potential lower than the first voltage source and to control, on the basis of the first selection control signal, the plurality of input signals and the second selection control signal, whether to discharge the charged first node by electrically connecting the first node to the second voltage source in a second period, the second period following the first period and being defined by the timing control signal, and an output circuit configured to output the first output signal having a potential according to a potential of the first node.

The object and advantages of the embodiment will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments will be described.

Embodiments

1. First Embodiment

Figure 1:
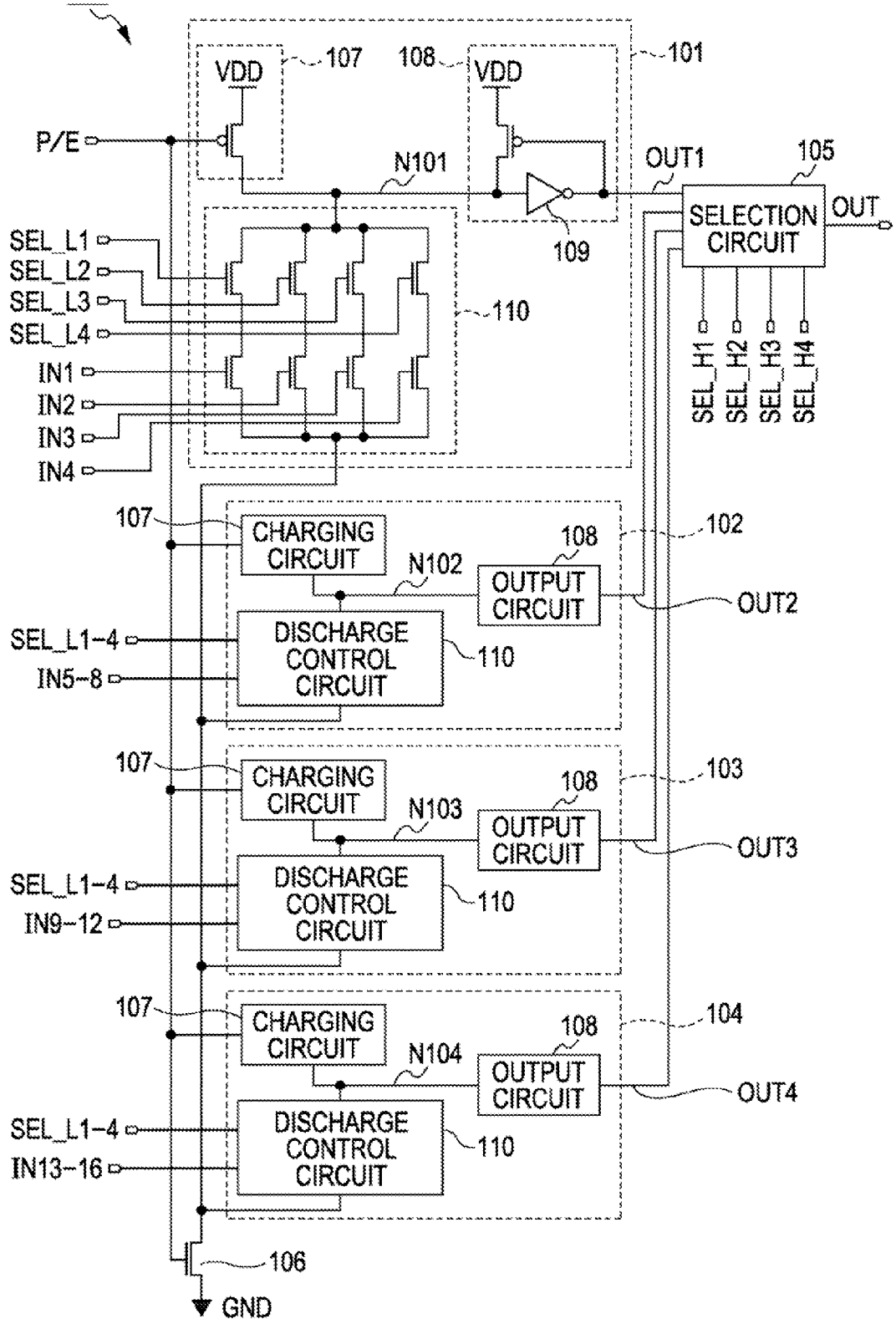
FIG. 1 is a diagram illustrating an example of a selector circuit.
Figure 2:
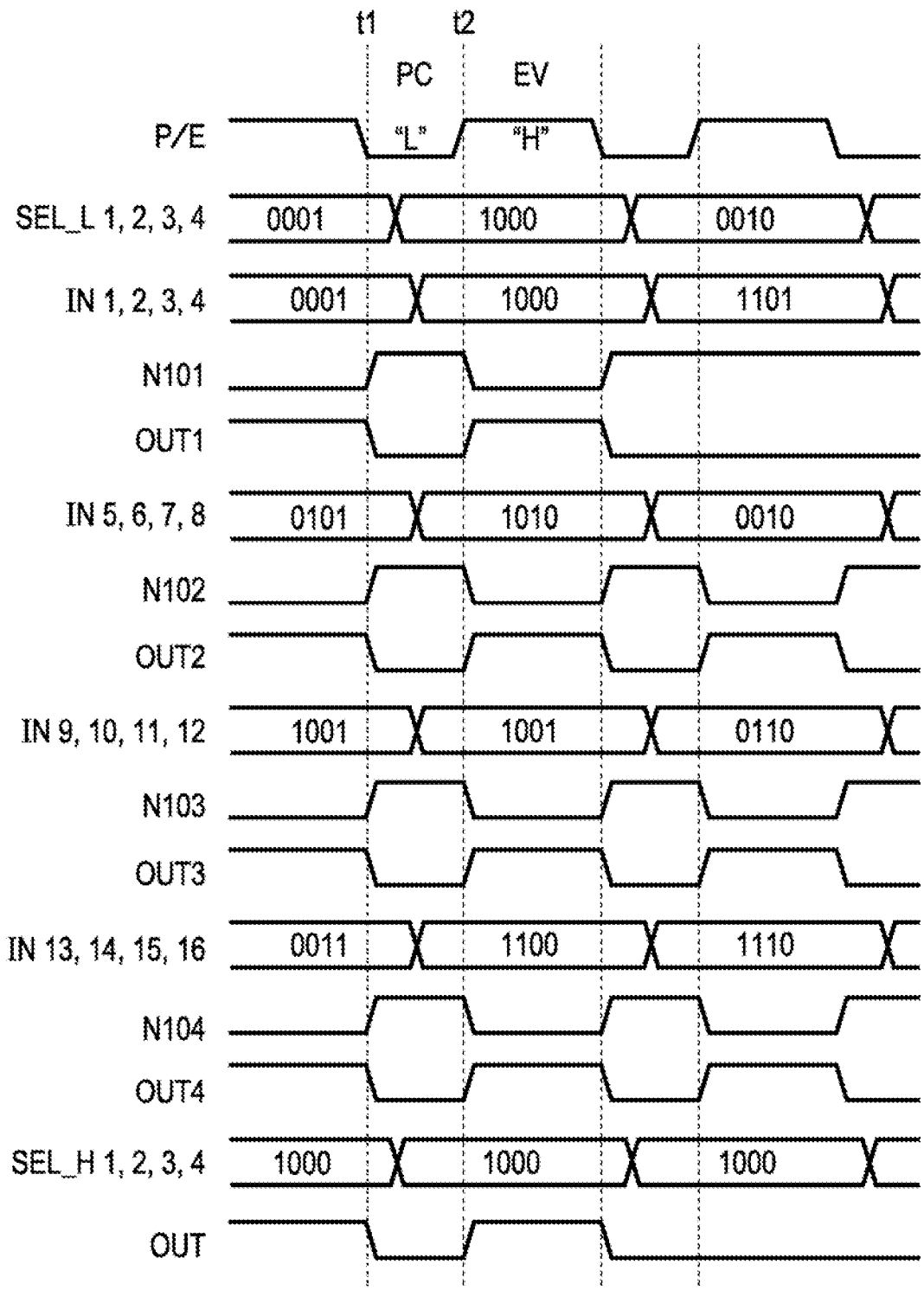
FIG. 2 is a diagram illustrating a timing chart of the selector circuit in FIG. 1.
Figure 3:
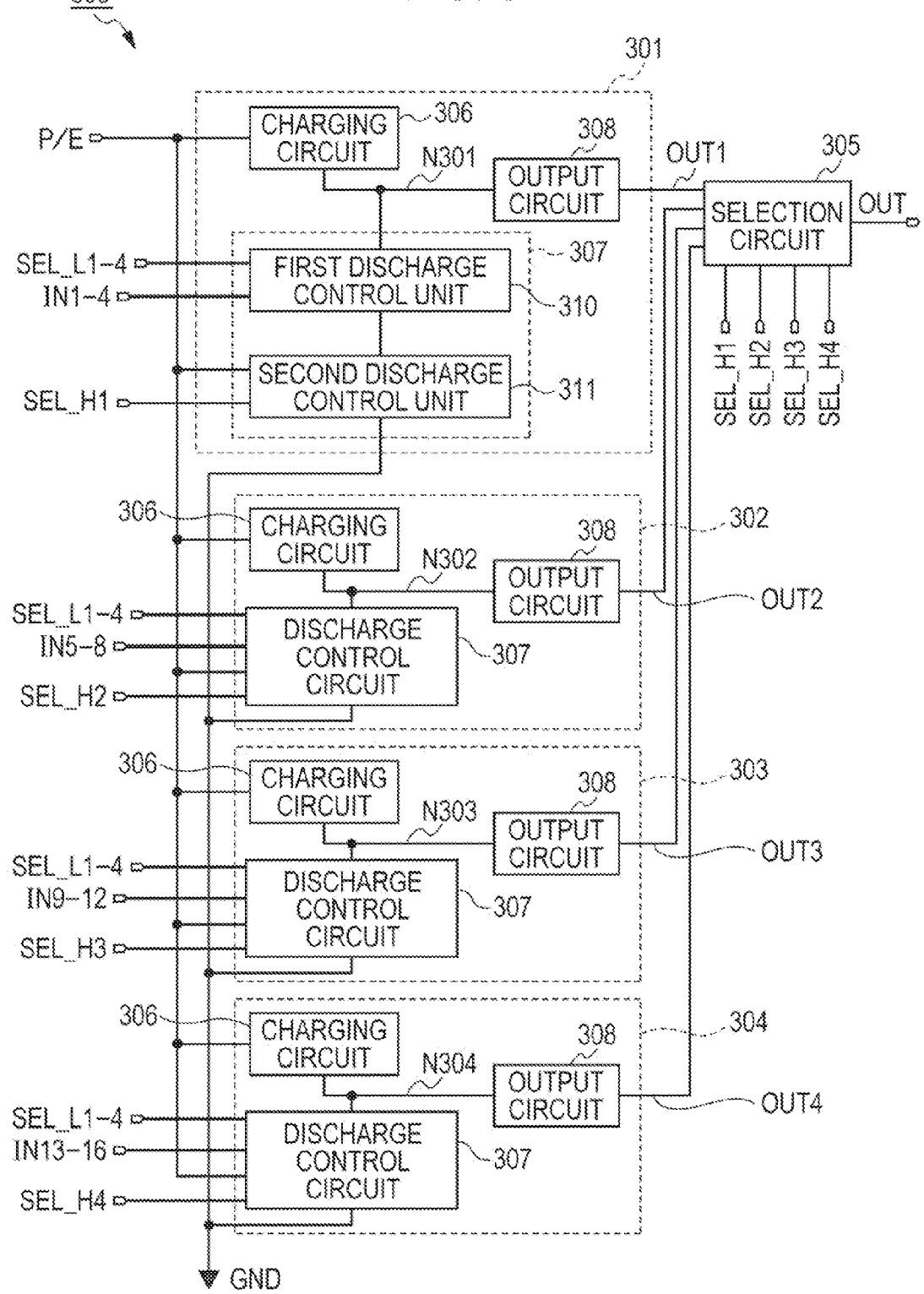
FIG. 3 is a diagram illustrating a selector circuit according to a first embodiment.

FIG. 3 is a diagram illustrating a selector circuit according to a first embodiment.

A selector circuit 300 illustrated in FIG. 3 includes selection circuits 301 to 304 located at a previous stage and a selection circuit 305 located at a subsequent stage, selects one signal from among 16 input signals IN1 to IN16, and outputs the signal as an output signal OUT. In addition, the number of input signals of the selector circuit 300 is not limited to 16, and can be arbitrarily changed in accordance with the utilization form thereof. In addition, while the selector circuit 300 adopts a 2-stage configuration in which the previous and the subsequent stages are included, the number of stages of the selection circuit is not limited to 2, and can be arbitrarily changed in accordance with the utilization form thereof.

As described later, in the selector circuit 300 illustrated in FIG. 3, the major portion of the logic of the selection circuits 301 to 304 located at the previous stage can be formed using N-channel transistors. Therefore, compared with a selector circuit whose logic is structured using CMOS circuits, complementary logic may not be structured using many P-channel transistors. Therefore, compared with a selector circuit in which a selection circuit located at a previous stage is structured using CMOS circuits, in the selector circuit 300, it is possible to speed up a circuit operation as a whole, and it is possible to reduce the total circuit size thereof.

[1-1. Whole Configuration of Selector Circuit]

As illustrated in FIG. 3, each of the selection circuits 301 to 304 receives four corresponding input signals from among 16 input signals IN1 to IN16, and selects one signal from among the four received input signals and outputs one of output signals OUT1 to OUT4. In addition, each of the number of the selection circuits located at the previous stage and the number of the input signals received by each selection circuit is not limited to 4, and can be arbitrarily changed on the basis of the utilization form thereof.

The selection circuit 305 located at the subsequent stage receives the output signals OUT1 to OUT4 of the selection circuits 301 to 304, and receives selection control signals SEL_H1 to SEL_H4 from a controller (not illustrated). On the basis of the selection control signals SEL_H1 to SEL_H4, the selection circuit 305 located at the subsequent stage selects one signal from among the four received output signals OUT1 to OUT4, and outputs the selected signal as an output signal OUT. In addition, the number of signals received by the selection circuit 305 located at the subsequent stage is not limited to 4, and can be arbitrarily changed on the basis of the utilization form thereof.

The selection control signals SEL_H1 to SEL_H4 are signals indicating which signal of the four output signals OUT1 to OUT4 of the selection circuits 301 to 304 located at the previous stage the selection circuit 305 located at the subsequent stage outputs as the output signal OUT. In the example illustrated in FIG. 3, the selection control signals SEL_H1 to SEL_H4 are associated with the output signals OUT1 to OUT4 of the selection circuits 301 to 304, respectively. Only one signal of the selection control signals SEL_H1 to SEL_H4 is set to an H level, and the three remaining signals are set to L levels. Accordingly, the selection circuit 305 selects one of the output signals OUT1 to OUT4 that corresponds to one of the selection control signals SEL_H1 to SEL_H4, which is set to the H level.

[1-2. Example of Circuit Configuration of Selection Circuit Located at Previous Stage]

Here, examples of the circuit configurations of the selection circuits 301 to 304 located at the previous stage will be described.

As illustrated in FIG. 3, each of the selection circuits 301 to 304 located at the previous stage receives common selection control signals SEL_L1 to SEL_L4 and a timing control signal P/E, supplied by a controller (not illustrated).

Furthermore, the selection circuits 301 to 304 receive the above-mentioned selection control signals SEL_H1 to SEL_H4. In the example illustrated in FIG. 3, the selection control signal SEL_H1 is supplied to the selection circuit 301, and in the same way, the selection control signals SEL_H2 to SEL_H4 are individually supplied to the selection circuits 302 to 304, respectively. In this regard, however, the form of the supply of the selection control signals SEL_H1 to SEL_H4 is not limited to the example, and plural or all selection control signals SEL_H may also be supplied to each selection circuit. The form of the supply can be arbitrarily changed depending on how the output signals OUT1 to OUT4 that are selection targets are expressed on the basis of the combination of the selection control signals SEL_H.

The selection circuits 301 to 304 located at the previous stage individually have the same circuit configuration. Accordingly, while, here, the selection circuit 301 will be cited as an example, and the circuit configuration and the circuit operation thereof will be described, the circuit configurations and the circuit operations of the other selection circuits 302 to 304 are also the same as those of the selection circuit 301. The following description of the selection circuit 301 turns out to be the description of each of the selection circuits 302 to 304 when the signals thereof are replaced by corresponding signals.

Figure 4:
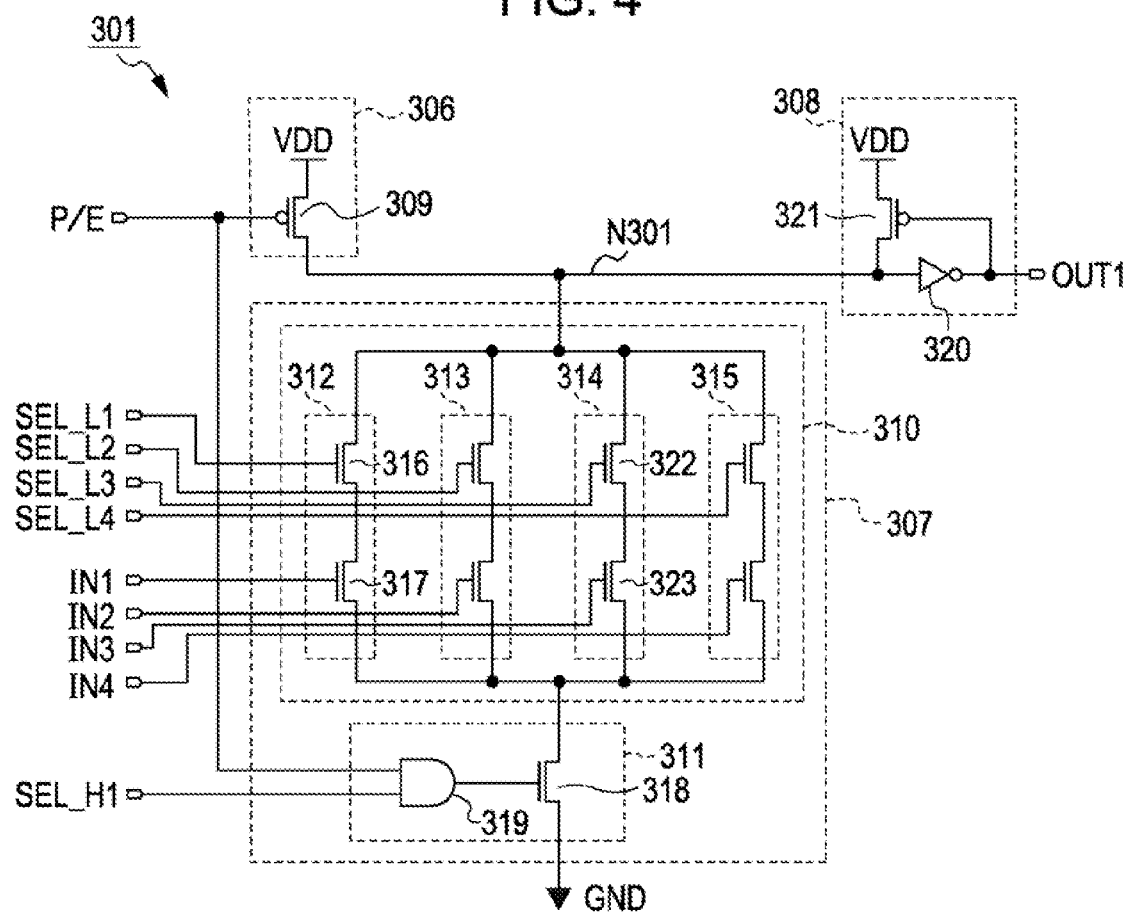
FIG. 4 is a diagram illustrating an example of a circuit configuration of a selection circuit located at a previous stage.

FIG. 4 is a diagram illustrating an example of the circuit configuration of the selection circuit 301 located at the previous stage. As illustrated in FIGS. 3 and 4, the selection circuit 301 includes a node N301, a charging circuit 306, a discharge control circuit 307, and an output circuit 308. The charging circuit 306 is provided between a voltage source line VDD and the node N301, and the discharge control circuit 307 is provided between the node N301 and a ground line GND. The node N301 is connected to the input node of the output circuit 308, and the output circuit 308 is connected to the output node of the output signal OUT1 of the selection circuit 301. As described later, the selection circuit 301 is a circuit that performs a selection operation on the basis of the charge and discharge of the node N301, and is a circuit called a dynamic selector.

The charging circuit 306 receives the timing control signal P/E supplied by the controller (not illustrated). In the example illustrated in FIG. 4, the charging circuit 306 is a P-channel transistor 309 provided between the voltage source line VDD and the node N301. The timing control signal P/E is input to the gate of the P-channel transistor 309. The P-channel transistor 309 is turned on during a period when the timing control signal P/E is of an L level, and the P-channel transistor 309 electrically connects the voltage source line VDD and the node N301 to each other. Accordingly, the charging circuit 306 charges the node N301 to an H level during the period when the timing control signal P/E is of an L level.

The discharge control circuit 307 includes a first discharge control unit 310 and a second discharge control unit 311. The first discharge control unit 310 receives input signals IN1 to IN4 and the selection control signals SEL_L1 to SEL_L4. In the example illustrated in FIG. 4, the first discharge control unit 310 includes four transistor arrays 312 to 315 connected to the node N301 in parallel. The selection control signal SEL_L1 and the input signal IN1 are input to the gates of two N-channel transistors 316 and 317 included in the transistor array 312, respectively. In the same way, the input signals IN2 to IN4 and the selection control signals SEL_L2 to SEL_L4 are input to the gates of N-channel transistors included in the transistor arrays 313 to 315.

The selection control signals SEL_L1 to SEL_L4 are signals indicating which signal of the four input signals the selection circuit 301 outputs as the output signal OUT1. In the example illustrated in FIG. 4, the selection control signals SEL_L1 to SEL_L4 are associated with the input signals IN1 to IN4, respectively. Only one signal of the selection control signals SEL_H1 to SEL_H4 is set to an H level, and the three remaining signals are set to L levels. Accordingly, one of the input signals IN1 to IN4 that corresponds to one of the selection control signals SEL_L1 to SEL_L4, which is set to the H level, is selected.

For example, when the selection control signal SEL_L1 is set to an H level, and the remaining selection control signals SEL_L2 to SEL_L4 are set to L levels, the N-channel transistor 316 in the transistor array 312 is turned on. Here, furthermore, when the input signal IN1 is of "1" (H level), the N-channel transistor 317 in the transistor array 312 is also turned on, and hence a conductive path formed by the transistor array 312 is put into an electrical conduction state. On the other hand, since, in the other transistor arrays 313 to 315, corresponding transistors are turned off owing to the selection control signal SEL_L2 to SEL_L4 of L levels, conductive paths are put into electrical non-conduction states regardless of the levels of the input signals IN2 to IN4.

Namely, in accordance with the levels of the input signals IN1 to IN4 selected on the basis of the selection control signals SEL_L1 to SEL_L4, the first discharge control unit 310 electrically connects the node N301 and the ground line GND to each other, and controls whether or not the node N301 is to be discharged.

The second discharge control unit 311 receives the timing control signal P/E and the selection control signal SEL_H1. In the example illustrated in FIG. 4, the second discharge control unit 311 includes an N-channel transistor 318, provided between the transistor arrays 312 to 315 and the ground line GND, and an AND circuit 319 that receives the timing control signal P/E and the selection control signal SEL_H1 and outputs a control signal to the gate of the N-channel transistor 318.

When the selection control signal SEL_H1 is of an H level, the AND circuit 319 outputs a signal of an H level during a period when the timing control signal P/E is of an H level, and the AND circuit 319 turns on the N-channel transistor 318. On the other hand, when the selection control signal SEL_H1 is of an L level, the AND circuit 319 outputs a signal of an L level and constantly turns off the N-channel transistor 319, regardless of the level of the timing control signal P/E.

Accordingly, when the selection control signal SEL_H1 is of an L level, namely, indicates that the selection circuit 305 located at the subsequent stage does not select the corresponding output signal OUT1, constantly the second discharge control unit 311 electrically disconnects the node N301 and the ground line GND from each other and prevents the discharge of the node N301, regardless of the level of the timing control signal P/E.

On the other hand, when the selection control signal SEL_H1 is of an H level, namely, indicates that the selection circuit 305 located at the subsequent stage selects the corresponding output signal OUT1, the second discharge control unit 311 electrically connects the node N301 and the ground line GND to each other to be put into a state in which the node N301 can be discharged, during a period when the timing control signal P/E is of an H level.

In the example illustrated in FIG. 4, the output circuit 308 includes an inverter 320, whose input node is connected to the node N301, and a P-channel transistor 321 that is provided between the voltage source line VDD and the input node of the inverter 320 and at the gate of which the output of the inverter 320 is received. The inverter 320 and the P-channel transistor 321 configure a feedback circuit.

Here, the P-channel transistor 321 is formed so that the driving force thereof is smaller than the driving forces of N-channel transistors included in the discharge control circuit 307. This is because, when the first discharge control unit 310 and the second discharge control unit 311 electrically connect the node 301 and the ground line GND to each other, the driving forces of individual transistors are adjusted so that the discharge control circuit 307 can swiftly discharge the node N301.

When the node N301 is of an H level, the output circuit 308 operates as a latch circuit holding the H level of the node N301, inverts the input level thereof, and outputs the output signal OUT1 of an L level. When the node N301 is of an L level, the output circuit 308 inverts the input level thereof, and outputs the output signal OUT1 of an H level. Namely, the output circuit 308 outputs, as the output signal OUT1, a signal whose level corresponds to the level of the node N301.

[1-3. Example of Circuit Operation of Selection Circuit Located at Previous Stage when Output Signal is Selected by Selection Circuit Located at Subsequent Stage]

Next, examples of the circuit operations of the selection circuits 301 to 304 located at the previous stage will be described. Here, the selection circuit 301 will also be cited as an example and described.

Figure 5:
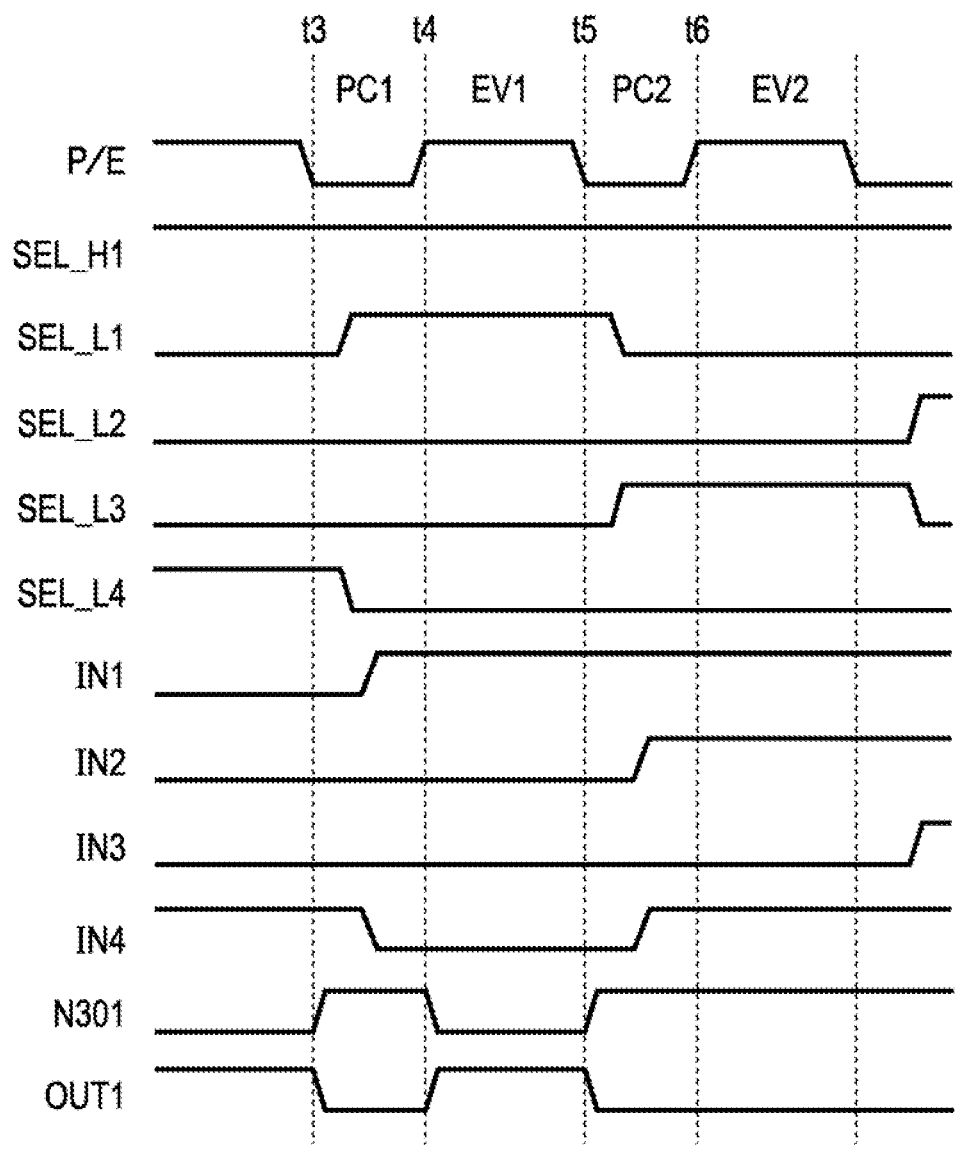
FIG. 5 is a diagram illustrating an example of a timing chart of the selection circuit when an output signal of the selection circuit located at the previous stage is selected in a selection circuit located at a subsequent stage.

FIG. 5 is a diagram illustrating an example of a timing chart of the selection circuit 301 located at the previous stage, and is a chart when the output signal OUT1 of the selection circuit 301 is selected in the selection circuit 305 located at the subsequent stage. Therefore, the selection control signal SEL_H1 is set to an H level.

An example of the circuit operation of the selection circuit 301 located at the previous stage will be described with reference to FIGS. 3, 4, and 5. The selection operation of the selection circuit 301 is performed by repeating an operation cycle including a precharge period and an evaluation period following the precharge period.

First, as illustrated in FIG. 5, at a time t3, the timing control signal P/E is set to an L level, and a precharge period PC1 starts. The L level of the timing control signal P/E indicates the precharge period. In the precharge period PC1, in response to the L level of the timing control signal P/E, the P-channel transistor 309 is turned on. Accordingly, the charging circuit 306 electrically connects the voltage source line VDD and the node N301 to each other, and charges the node N301 to an H level. The H level of the node N301 is held by the latching function of the output circuit 308.

At this time, since, in the discharge control circuit 307, the AND circuit 319 outputs a signal of an L level in response to the L level of the timing control signal P/E, the N-channel transistor 318 is turned off. Accordingly, the second discharge control unit 311 electrically disconnects the node N301 and the ground line GND from each other.

In addition, in the precharge period PC1, a controller (not illustrated) controls each signal of the selection control signals SEL_H1 to SEL_H4, the selection control signals SEL_L1 to SEL_L4, and the input signals IN1 to IN4 so that the level thereof is established.

In the example illustrated in FIG. 5, the selection control signal SEL_H1 is set to an H level. This indicates that the output signal OUT1 of the selection circuit 301 is selected in the selection circuit 305 located at the subsequent stage. The selection control signal SEL_L1 is set to an H level, and the remaining selection control signals SEL_L2 to SEL_L4 are set to L levels. This indicates that the input signal IN1 is selected as the output signal OUT1 in the selection circuit 301. The input signal IN1 is set to an H level ("1"), and the remaining input signals IN2 to IN4 are set to L levels ("0").

Next, at a time t4, the timing control signal P/E is set to an H level, and an evaluation period EV1 starts. The H level of the timing control signal P/E indicates the evaluation period. In the evaluation period, the P-channel transistor 309 is turned off in response to the H level of the timing control signal P/E. Accordingly, the node N101 is electrically disconnected from the voltage source VDD.

At this time, in the second discharge control unit 311, the AND circuit 319 outputs a signal of an H level in response to the H level of the timing control signal P/E and the H level of the selection control signal SEL_H1. Therefore, the N-channel transistor 318 is turned on.

In addition, in the first discharge control unit 310, the N-channel transistor 316 and the N-channel transistor 317 are turned on in response to the H level of the selection control signal SEL_L1 and the H level ("1") of the input signal IN1, respectively, and hence a conductive path formed by the transistor array 312 is put into an electrical conduction state. In addition, individual corresponding transistors are turned off owing to the L levels of the selection control signals SEL_L2 to SEL_L4, and hence the other transistor arrays 313 to 315 are put into electrical non-conduction states regardless of the levels of the input signals IN2 to IN4.

Accordingly, the node N301 and the ground line GND are electrically connected to each other by the discharge control circuit 307 through the transistor array 312 and the N-channel transistor 318. Accordingly, in the evaluation period EV1, the node N301 that has been charged to an H level in the precharge period PC1 is discharged, and the node N301 becomes an L level.

The output circuit 308 receives the L level of the node N301, and outputs an signal of an H level ("1") as the output signal OUT1, using the inverter 320.

Namely, in the evaluation period EV1, the selection circuit 301 selects the input signal IN1 on the basis of the selection control signals SEL_L1 to SEL_L4, and outputs the output signal OUT1 having the same level as the H level of the input signal IN1.

Next, at a time t5, the timing control signal P/E is set to an L level again, and a precharge period PC2 starts. In the same way as the previous precharge period PC1, the second discharge control unit 311 electrically disconnects the node N301 and the ground line GND from each other, and the charging circuit 306 connects the node N301 to the voltage source line VDD and charges the node N301 to an H level. The H level of the node N301 is held by the latching function of the output circuit 308.

In the example illustrated in FIG. 5, in the precharge period PC2, the selection control signal SEL_H1 is set to an H level. This indicates that the output signal OUT1 of the selection circuit 301 is selected in the selection circuit 305 located at the subsequent stage. The selection control signal SEL_L3 is set to an H level, and the remaining selection control signals SEL_L1, SEL_L2, and SEL_L4 are set to L levels. This indicates that the input signal IN3 is selected as the output signal OUT1 in the selection circuit 301. The input signal IN3 is set to an L level ("0"), and the remaining input signals IN1, IN2, and IN4 are set to H levels ("1").

Next, at a time t6, the timing control signal P/E is set to an H level again, and an evaluation period EV2 starts. In the same way as the previous evaluation period EV1, since the charging circuit 306 electrically disconnects the node N301 and the voltage source line VDD from each other, and the selection control signal SEL_H1 is of an H level, the N-channel transistor 318 is turned on in the second discharge control unit 311.

At this time, in the first discharge control unit 310, an N-channel transistor 322 is turned on in response to the H level of the selection control signal SEL_L3 and the L level ("0") of the input signal IN3, and an N-channel transistor 323 is turned off. Accordingly, a conductive path formed by the transistor array 314 is put into an electrical non-conduction state. In addition, individual corresponding transistors are turned off owing to the L levels of the selection control signals SEL_L1, SEL_L2, and SEL_L4, and hence the other transistor arrays 312, 313, and 315 are put into electrical non-conduction states, regardless of the levels of the input signals IN1, IN2, and IN4.

Accordingly, in the evaluation period EV2, following the precharge period PC2, a state is maintained in which the first discharge control unit 310 in the discharge control circuit 307 electrically disconnects the node N301 and the voltage source line VDD from each other. Accordingly, the node N301 that has been charged to an H level in the precharge period PC2 is not discharged, and the node N301 is maintained at an H level.

The output circuit 308 receives the H level of the node N301, and outputs a signal of an L level ("0") as the output signal OUT1, using the inverter 320.

Namely, in the evaluation period EV2, the selection circuit 301 selects the input signal IN3 on the basis of the selection control signals SEL_L1 to SEL_L4, and outputs the output signal OUT1 having the same level as the L level of the input signal IN3.

As described above, when the output signal OUT1 is selected in the selection circuit 305 located at the subsequent stage, the selection circuit 301 selects one of the input signals IN1 to IN4 on the basis of the selection control signals SEL_L1 to SEL_L4, and outputs the output signal OUT1 having a level corresponding to the level of the selected input signal.

[1-4. Example of Circuit Operation of Selection Circuit Located at Previous Stage when Output Signal is not Selected by Selection Circuit Located at Subsequent Stage]

Figure 6:
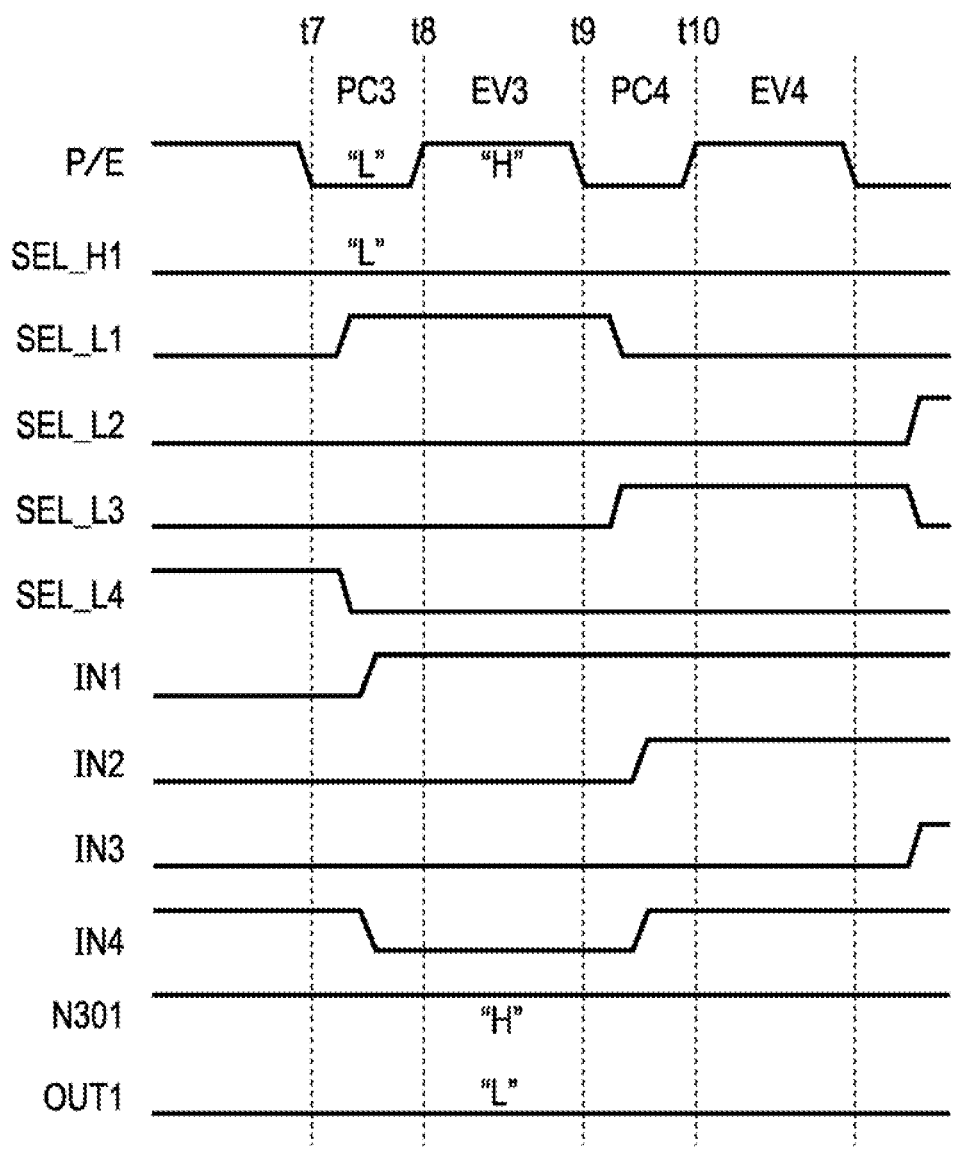
FIG. 6 is a diagram illustrating an example of a timing chart of the selection circuit when the output signal of the selection circuit located at the previous stage is not selected in the selection circuit located at the subsequent stage.

FIG. 6 is a diagram illustrating an example of a timing chart of the selection circuit 301 located at the previous stage, and is a chart when the output signal OUT1 of the selection circuit 301 is not selected in the selection circuit 305 located at the subsequent stage. Therefore, the selection control signal SEL_H1 is set to an L level.

An example of the circuit operation of the selection circuit 301 located at the previous stage will be described with reference to FIGS. 3, 4, and 6.

First, as illustrated in FIG. 6, at a time t7, the timing control signal P/E is set to an L level, and a precharge period PC3 starts. In the same way as the case of the example illustrated in FIG. 5, in the period PC3, the second discharge control unit 311 electrically disconnects the node N301 and the ground line GND from each other on the basis of the level L of the timing control signal P/E, and the charging circuit 306 connects the node N301 to the voltage source line VDD and charges the node N301 to an H level. The H level of the node N301 is held by the latching function of the output circuit 308.

In the example illustrated in FIG. 6, in the precharge period PC3, the selection control signal SEL_H1 is set to an L level. This indicates that the output signal OUT1 of the selection circuit 301 is not selected in the selection circuit 305 located at the subsequent stage. The selection control signal SEL_L1 is set to an H level, and the remaining selection control signals SEL_L2 to SEL_L4 are set to L levels. The input signal IN1 is set to an H level ("1"), and the remaining input signals IN2 to IN4 are set to L levels ("0").

Next, at a time t8, the timing control signal P/E is set to an H level, and an evaluation period EV3 starts. In the evaluation period EV3, the P-channel transistor 309 is turned off in response to the H level of the timing control signal P/E. Accordingly, the node N101 is electrically disconnected from the voltage source VDD.

At this time, in the second discharge control unit 311, the AND circuit 319 outputs a signal of an L level in response to the L level of the selection control signal SEL_H1. Therefore, the N-channel transistor 318 is turned off. Here, in the previous precharge period PC3, the selection control signal SEL_H1 of an L level is supplied to one input of the AND circuit 319. Accordingly, even after the precharge period PC3 has shifted to the evaluation period EV3 and the timing control signal P/E transits from an L level to an H level, the AND circuit 319 continues to output a signal of an L level, following the precharge period PC3. Accordingly, the N-channel transistor 318 continues to be turned off, following the previous precharge period PC3.

Therefore, following the previous precharge period PC3, a state is maintained in which the second discharge control unit 311 electrically disconnects the node N301 and the ground line GND from each other, regardless of the electrical conduction states of conductive paths formed by the transistor arrays 312 to 315, namely, the levels of the selection control signals SEL_L1 to SEL_L4 and the input signals IN1 to IN4.

In the example illustrated in FIG. 6, the N-channel transistor 316 and the N-channel transistor 317 are turned on in response to the H level of the selection control signal SEL_L1 and the H level of the input signal IN1, respectively, and hence the conductive path formed by the transistor array 312 is put into an electrical conduction state. However, since the N-channel transistor 318 in the second discharge control unit 311 is turned off, a state is maintained in which the node N301 and the ground line GND are electrically disconnected from each other.

Accordingly, in the evaluation period EV3, regardless of the signal levels of the selection control signals SEL_L1 to SEL_L4 and the input signals IN1 to IN4, the node N301 that has been charged to an H level in the precharge period PC3 is not discharged to an L level.

Since the potential of the node N301 is held by the latching function of the output circuit 308, the node N301 maintains an H level. The output circuit 308 receives the H level of the node N301, and outputs the output signal OUT1 of an L level.

Namely, when the output signal OUT1 of the selection circuit 301 is not selected in the selection circuit 305 located at the subsequent stage, the selection circuit 301 does not perform any selection operation. Regardless of the levels of the selection control signals SEL_L1 to SEL_L4 and the input signals IN1 to IN4, the output circuit 308 outputs the output signal OUT1 having a predetermined fixed level.

Next, in a subsequent precharge period PC4 and an evaluation period EV4 starting from times t9 and t10, respectively, the selection control signal SEL_H1 is also maintained at an L level, following the previous evaluation period EV3. Namely, the output signal OUT1 of the selection circuit 301 continues not to be selected in the selection circuit 305 located at the subsequent stage.

Accordingly, following the previous evaluation period EV3, the AND circuit 319 continues to output a signal of an L level through the precharge period PC4 and the evaluation period EV4. Consequently, the N-channel transistor 318 also continues to be turned off. Accordingly, following the previous evaluation period EV3, a state is continued in which the node N301 and the ground line GND are electrically disconnected from each other, through the precharge period PC4 and the evaluation period EV4.

Therefore, also in the evaluation period EV4, regardless of the signal levels of the selection control signals SEL_L1 to SEL_L4 and the input signals IN1 to IN4, the node N301 that has been charged to an H level in the precharge periods PC3 and PC4 is not discharged to an L level. The node N301 maintains an H level through the precharge period PC4 and the evaluation period EV4, and the output circuit 308 receives the H level of the node N301 and outputs the output signal OUT1 of an L level.

Namely, when, following the previous evaluation period, the output signal OUT1 of the selection circuit 301 is not selected in the selection circuit 305 located at the subsequent stage, the selection circuit 301 continues not to select any selection operation. Regardless of the levels of the selection control signals SEL_L1 to SEL_L4 and the input signals IN1 to IN4, the output circuit 308 continues to output the output signal OUT1 having the same fixed level.

As described above, in the selection circuit 301, the selection control signal SEL_H1 is supplied to the discharge control circuit 307, and on the basis of the selection control signal SEL_H1, the discharge control circuit 307 controls whether or not the node N301 and the ground line GND are to be electrically connected to each other. Accordingly, when the output signal OUT1 of the selection circuit 301 is not selected in the selection circuit 305 located at the subsequent stage, the discharge control circuit 307 can electrically disconnect the node N301 and the ground line GND from each other in the evaluation period, regardless of the levels of the selection control signals SEL_L1 to SEL_L4 and the input signals IN1 to IN4.

Accordingly, since, in a selection circuit located at a previous stage, whose output signal is not selected, it is possible to inhibit a node that has been charged to an H level in a precharge period from being discharged to an L level in an evaluation period, no unwanted consumption current occurs in the evaluation period, and it is possible to prevent useless electric power from being consumed.

In addition, when the output signal OUT1 of the selection circuit 301 is not selected in the selection circuit 305 located at the subsequent stage, the selection control signal SEL_H1 continues to be maintained at an L level through a continuous operation cycle including the precharge period and the evaluation period. Accordingly, the discharge control circuit 307 continues to electrically disconnect the node N301 and the ground line GND from each other.

Therefore, since, in a selection circuit located at a previous stage, whose output signal is not selected, it is possible to constantly maintain a state in which the node N301 and the ground line GND are electrically disconnected from each other, it is possible to certainly prevent electric power from being consumed owing to discharge, and it is possible to keep electric power at an actually negligible level, the electric power being consumed in the selection circuit located at the previous stage, whose output signal is not selected.

In addition, the discharge control circuit 307 are separated into the first discharge control unit 310 to which the selection control signals SEL_L1 to SEL_L4 and the input signals IN1 to IN4 are supplied and the second discharge control unit 311 to which the selection control signal SEL_H1 is supplied. When the output signal OUT1 is not selected in the selection circuit 305 located at the subsequent stage, the second discharge control unit 311 electrically disconnects, on the basis of the L level of the selection control signal SEL_H1, the node N301 and the ground line GND from each other through a series of operation cycles including the precharge period and the evaluation period, regardless of the levels of the selection control signals SEL_L1 to SEL_L4 and the input signals IN1 to IN4.

Accordingly, in the selection circuit located at the previous stage, whose output signal is not selected, a control operation, in which the node N301 and the ground line GND are electrically disconnected from each other and useless discharge is inhibited, can be realized using a simple circuit configuration. Therefore, it is possible to perform control of inhibiting discharge with curbing the increase of a circuit size.

In particular, in the second discharge control unit 311, since the above-mentioned control of inhibiting discharge is realized using the AND circuit 319, it is possible to minimize the increase of a circuit size associated with the control of inhibiting discharge.

In addition, in the evaluation period, the node N301 is electrically disconnected from both of the voltage source line VDD and the ground line GND. Accordingly, when a turnoff leak current greater than or equal to a certain acceptable amount exists in each of transistors included in the discharge control circuit 307, there may be considered to occur a trouble that the node N301 is discharged in the evaluation period owing to the leak current and hence the potential of the node N301 becomes unstable or is inverted to an L level.

On the other hand, since the output circuit 308 can latch and hold the H level of the charged node N301, it is possible to stabilize the potential of the node N301 and prevent the above-mentioned trouble from occurring. Therefore, it is possible to prevent the malfunction of the selector circuit 300.

[1-5. Example of Circuit Operation of Whole Selector Circuit]

Figure 7:
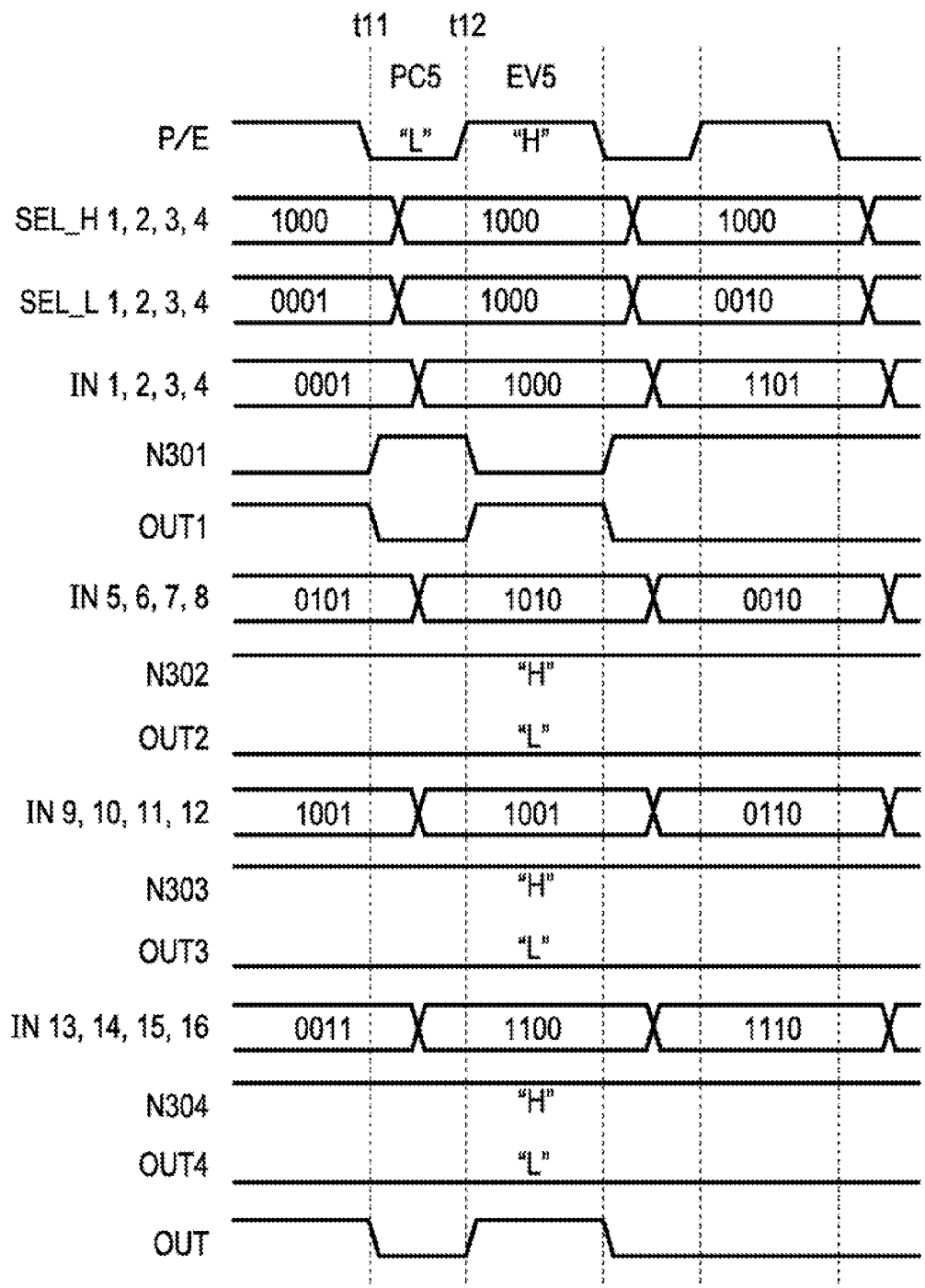
FIG. 7 is a diagram illustrating an example of a timing chart of a whole selector circuit.

FIG. 7 is a diagram illustrating an example of the timing chart of the whole selector circuit 300.

In the example illustrated in FIG. 7, the output signal OUT1 of the selection circuit 301 located at the previous stage is selected in the selection circuit 305 located at the subsequent stage, and the output signals OUT2 to OUT4 of the remaining selection circuits 302 to 304 are not selected. The selection circuit 305 located at the subsequent stage selects the output signal OUT1 of the selection circuit 301 located at the previous stage and outputs the output signal OUT1 as the output signal OUT. The operation of each of the selection circuits 301 to 304 located at the previous stage is as explained using FIGS. 4 and 5, and the detailed description thereof will be omitted.

The output signal OUT1 of the selection circuit 301 is selected in the selection circuit 305 located at the subsequent stage. Therefore, after the node N301 has been charged to an H level in a precharge period PC5 starting from a time t11, the node N301 is discharged to an L level in an evaluation period EV5 starting from a time t12, and hence the selection circuit 301 outputs the output signal OUT1 of an H level, which corresponds to the H level ("1") of the input signal IN1.

On the other hand, the output signals OUT2 to OUT4 of the selection circuits 302 to 304 are not selected in the selection circuit 305 located at the subsequent stage. Therefore, after the nodes N302 to N304 have been charged to H levels in the precharge period PC5, the selection circuits 302 to 304 maintain the nodes N302 to N304 at H levels in the evaluation period EV5 without discharging the nodes N302 to N304 that have been charged to H levels. Therefore, in the selection circuits 302 to 304, no useless discharge occurs during the circuit operations thereof. No unwanted consumption current occurs. Regardless of the level of the input signal IN, the selection circuits 302 to 304 outputs the output signals OUT2 to OUT4 of L levels.

As described above, since, in the selector circuit 300, it is possible to inhibit a node that has been charged to an H level in a precharge period from being discharged to an L level, no unwanted consumption current is caused to occur, and it is possible to prevent useless electric power from being consumed. Accordingly power consumption of the whole circuit is reduced by using the selector circuit 300.

For example, as illustrated in FIG. 3, when a circuit configuration is adopted in which one output signal is selected and output from the four selection circuits 301 to 304 located at the previous stage, the selector circuit 300 can keep electric power at an actually negligible level, the electric power being consumed in the three selection circuits located at the previous stage, whose output signals are not selected. Therefore, it is possible to reduce the electric power consumption of the whole circuit to up to about one quarter. The effect of the electric power consumption reduction increases with an increase in the number of the selection circuits located at the previous stage.

In addition, in the selector circuit 300 illustrated in FIG. 3, for example, the selection circuit 305 located at the previous stage is a CMOS circuit, and is a selector circuit whose logic is formed using CMOS circuits. The selector circuit whose logic is formed using CMOS circuits is called a static selector. In this regard, however, the circuit configuration of the selection circuit 305 is not limited to this example, and a dynamic selector may also be adopted that has the same circuit configuration as that of the selection circuit 301, for example.

2. Second Embodiment

Figure 8:
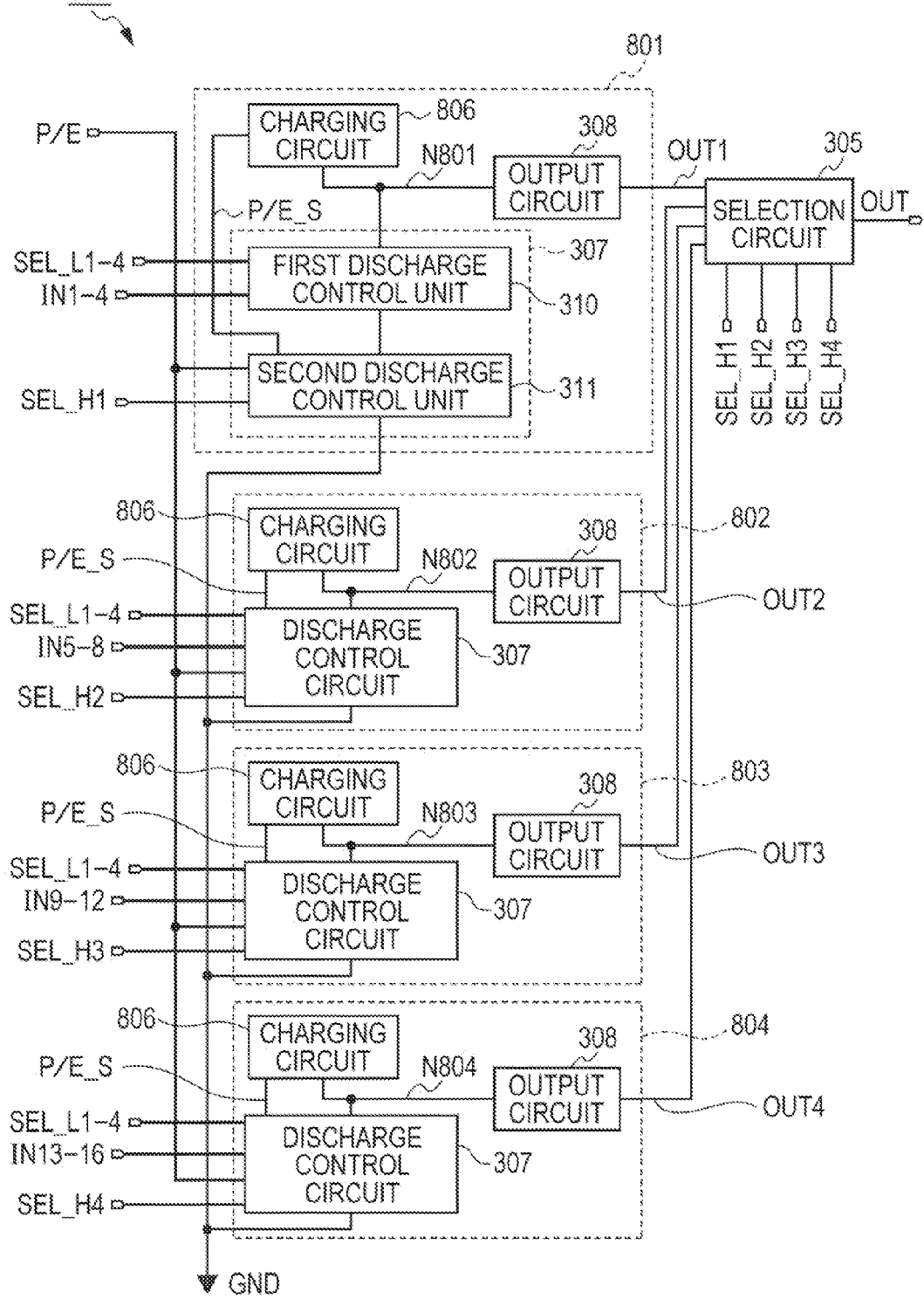
FIG. 8 is a diagram illustrating a selector circuit according to a second embodiment.

FIG. 8 is a diagram illustrating a selector circuit according to a second embodiment. While a selector circuit 800 according to the second embodiment, illustrated in FIG. 8, differs from the selector circuit 300 according to the first embodiment, illustrated in FIGS. 3 and 4, in the control of a charging circuit included in a selection circuit located at a previous stage, the other portions are the same as those of the selector circuit 300.

Also in the selector circuit 800 illustrated in FIG. 8, each of selection circuits 801 to 804 located at a previous stage has a same circuit configuration. Accordingly, while the selection circuit 801 located at the previous stage will be cited as an example and described, each of the other selection circuits 802 to 804 also has the same circuit configuration and circuit operation as those of the selection circuit 801.

Figure 9:
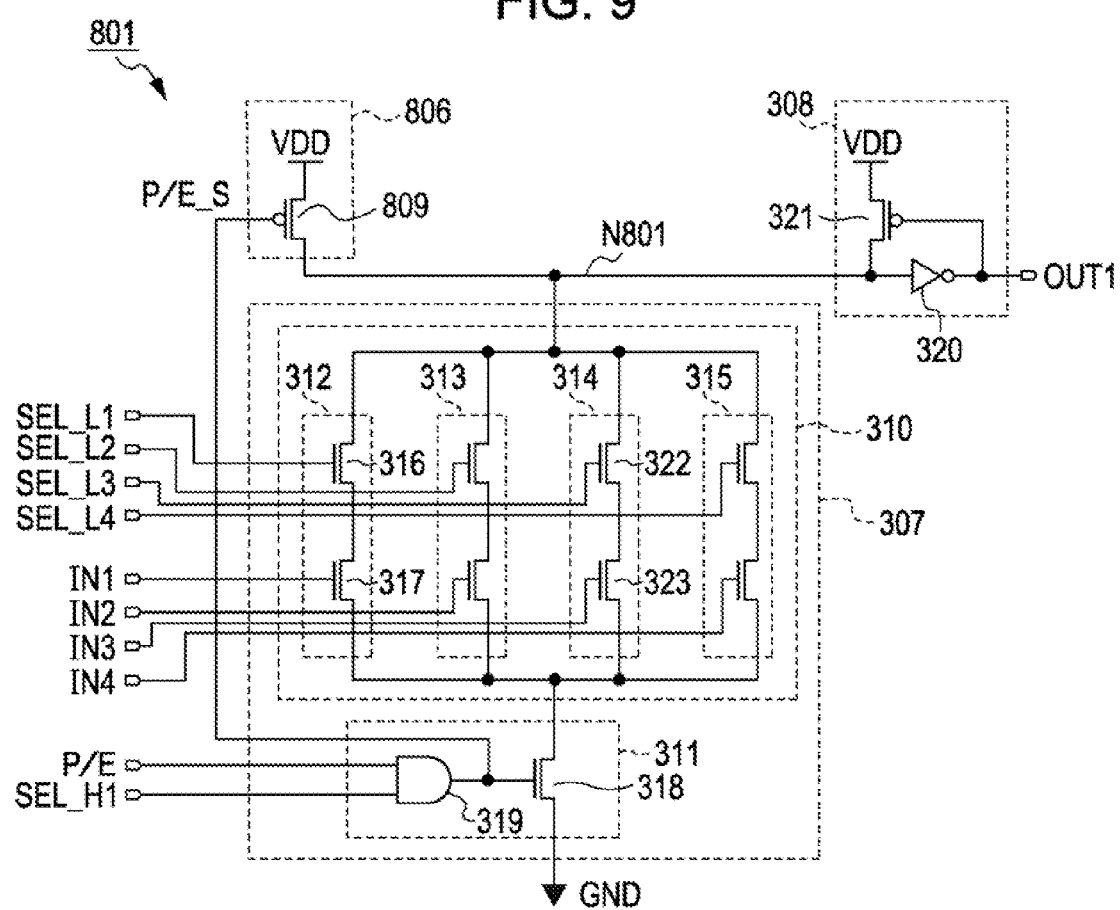
FIG. 9 is a diagram illustrating an example of a circuit configuration of a selection circuit located at a previous stage according to the second embodiment.

FIG. 9 is a diagram illustrating an example of the circuit configuration of the selection circuit 801 located at the previous stage. In FIGS. 8 and 9, the same symbol is assigned to the same portion as or a portion corresponding to that of the selector circuit 300 illustrated in FIGS. 3 and 4.

While the charging circuit 306 illustrated in FIGS. 3 and 4 receives the timing control signal P/E, a charging circuit 806 in the selection circuit 801 illustrated in FIGS. 8 and 9 receives the output signal P/E_S of the AND circuit 319 included in the second discharge control unit 311. The output signal P/E_S of the AND circuit 319 is input to the gate of a P-channel transistor 809 in the charging circuit 806.

When the output signal OUT1 of the selection circuit 801 is selected in the selection circuit 305 located at the subsequent stage, the selection control signal SEL_H1 is set to an H level. Accordingly, the AND circuit 319 receives the selection control signal SEL_H1 of an H level as one input thereof. Therefore, the AND circuit 319 outputs, as the output signal P/E_S, a signal whose level is the same as that of the timing control signal P/E that is the other input thereof.

Accordingly, when the output signal OUT1 of the selection circuit 801 is selected in the selection circuit 305 located at the subsequent stage, the operation of the charging circuit 806 is the same as that of the charging circuit 306 illustrated in FIGS. 3 and 4. Namely, the charging circuit 806 connects a node N801 to the voltage source line VDD in a precharge period, and disconnects the node N801 from the voltage source line VDD in an evaluation period.

On the other hand, when the output signal OUT1 of the selection circuit 801 is not selected in the selection circuit 305 located at the subsequent stage, the selection control signal SEL_H1 is set to an L level. Accordingly, the AND circuit 319 receives the selection control signal SEL_H1 of an L level as one input thereof. Therefore, the AND circuit 319 constantly outputs a signal of an L level as the output signal P/E_S, regardless of the level of the timing control signal P/E.

Accordingly, when the output signal OUT1 of the selection circuit 801 is not selected in the selection circuit 305 located at the subsequent stage, the P-channel transistor 809 in the charging circuit 806 is constantly turned on, regardless of the level of the timing control signal P/E. Namely, the charging circuit 806 constantly connects the node N801 to the voltage source line VDD through the precharge period and the evaluation period, and continues to charge the node N801 to an H level.

In addition, since the circuit operation of the discharge control circuit 307 is the same as that of the discharge control circuit 307 illustrated in FIGS. 3 and 4, the description thereof will be omitted.

Here, as described above, in the selection circuit 301 illustrated in FIG. 3, there may be considered to occur a trouble that the node N301 which has been charged to an H level is discharged in the evaluation period owing to the turnoff leak current in each of transistors included in the discharge control circuit 307 and hence the potential of the node N301 becomes unstable or is inverted to an L level.

On the other hand, while the output circuit 308 has a function of latching the H level of the charged node N301, the driving capability of the P-channel transistor 321 is limited as described above, and it is difficult to fully increase the driving capability. Therefore, when the above-mentioned leak current is increased, there is a possibility that it is difficult to stabilize the potential of the node N301 just using the latching function of the output circuit 308.

On the other hand, the charging circuit 806 constantly electrically connects the node N801 to the voltage source line VDD through the precharge period and the evaluation period. In addition, the P-channel transistor 809 included in the charging circuit 806 differs from the P-channel transistor 321 included in the output circuit 308, and the P-channel transistor 809 is formed so as to have enough driving capability to charge the node N801. Therefore, in the selection circuit 801 illustrated in FIG. 8, even if the above-mentioned leak current is increased, it is possible to stabilize the potential of the node N801 and it is possible to prevent the above-mentioned trouble from occurring. Therefore, it is possible to certainly prevent the malfunction of the selector circuit 800.

3. Third Embodiment

Figure 10:
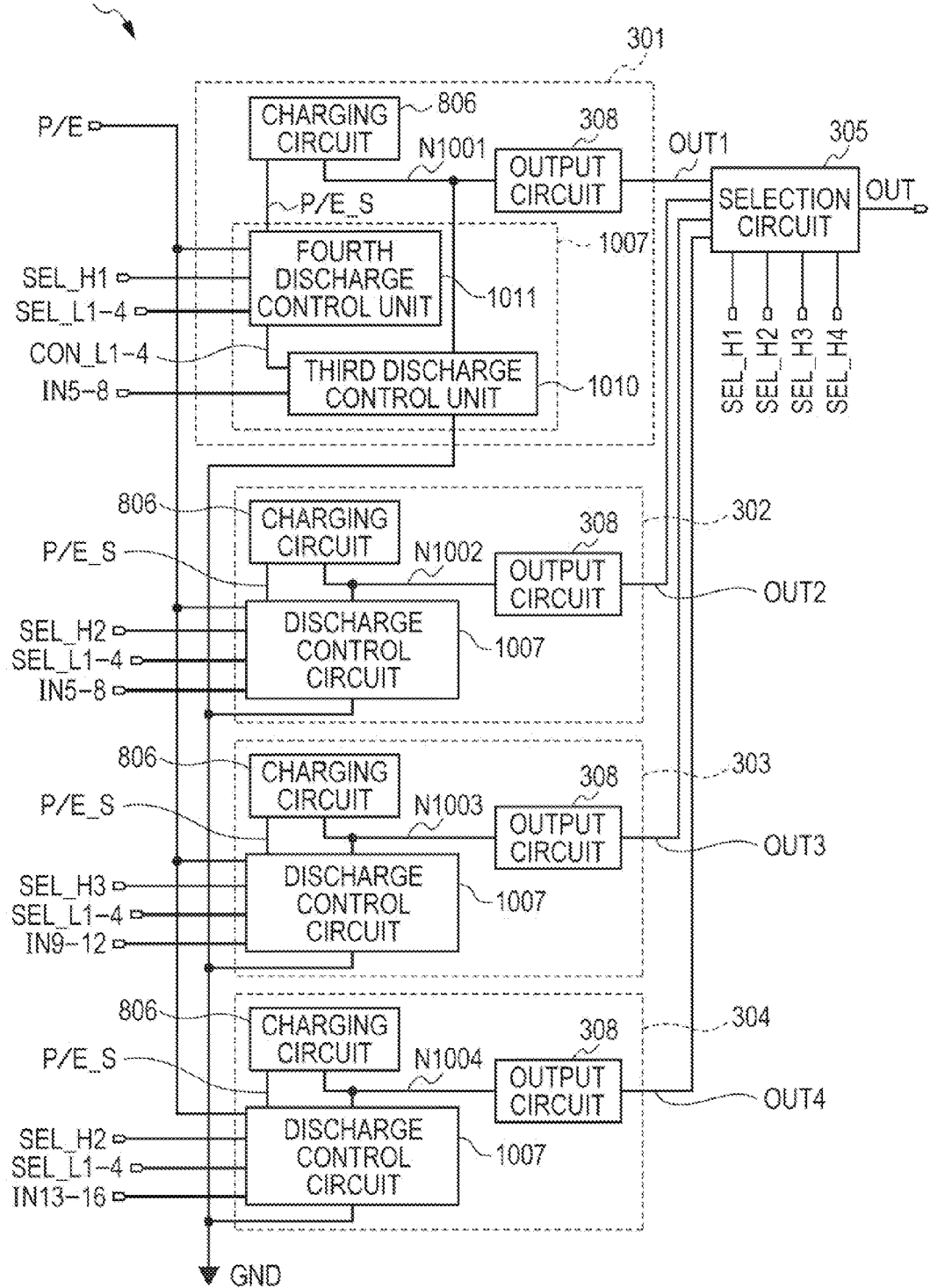
FIG. 10 is a diagram illustrating a selector circuit according to a third embodiment.

FIG. 10 is a diagram illustrating a selector circuit according to a third embodiment. A selector circuit 1000 according to the third embodiment illustrated in FIG. 10 differs from the selector circuit 300 according to the first embodiment, illustrated in FIGS. 3 and 4, and the selector circuit 800 according to the second embodiment, illustrated in FIGS. 8 and 9, in the circuit configuration of a discharge control circuit, the other portions are the same as those of the selector circuit 300 and the selector circuit 800.

Also in the selector circuit 1000 illustrated in FIG. 10, each of selection circuits 1001 to 1004 located at a previous stage has a same circuit configuration. Accordingly, while the selection circuit 1001 located at the previous stage will be cited as an example and described, each of the other selection circuits 1002 to 1004 also has the same circuit configuration and circuit operation as those of the selection circuit 1001.

[3-1. Example of Circuit Configuration of Selection Circuit Located at Previous Stage]

Figure 11:
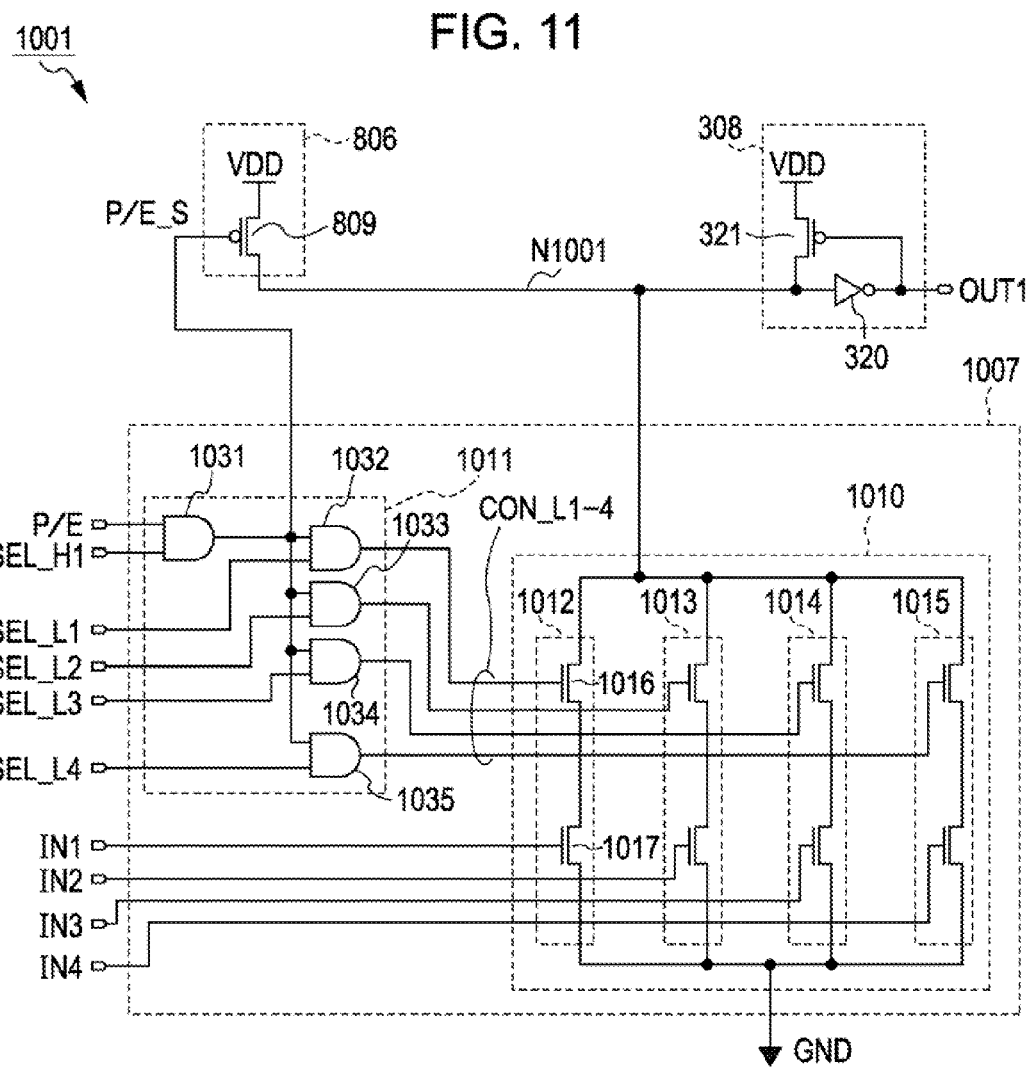
FIG. 11 is a diagram illustrating an example of a circuit configuration of a selection circuit located at a previous stage according to the third embodiment.

FIG. 11 is a diagram illustrating an example of the circuit configuration of the selection circuit 1001 located at the previous stage. In FIGS. 10 and 11, the same symbol is assigned to the same portion as or a portion corresponding to that of the selector circuit 300 illustrated in FIG. 3.

In the selection circuit 1001 illustrated in FIGS. 10 and 11, a discharge control circuit 1007 includes a third discharge control unit 1010 and a fourth discharge control unit 1011. The third discharge control unit 1010 is provided between a node N1001 and the ground line GND, and includes transistor arrays 1012 to 1015 provided in parallel between the node N1001 and the ground line GND. The input signal IN1 and a control signal CON_L1 output by the fourth discharge control unit 1011 are input to the gates of two N-channel transistors 1017 and 1016 included in the transistor array 1012, respectively. In the same way, the input signals IN2 to IN4 and control signals CON_L2 to CON_L4 are input to the gates of N-channel transistors included in the transistor arrays 1013 to 1015.

The fourth discharge control unit 1011 includes an AND circuit 1031 that receives the timing control signal P/E and the selection control signal SEL_H1 and AND circuits 1032 to 1035 that receive the output signal P/E_S of the AND circuit 1031 and receive the selection control signals SEL_L1 to SEL_L4, respectively. The AND circuit 1032 outputs the control signal CON_L1, and controls the operation of the N-channel transistor 1016 in the transistor array 1012. In the same way, the AND circuits 1033 to 1035 output control signals CON_L2 to CON_L4, respectively, and control the operations of corresponding transistors in the transistor arrays 1013 to 1015, respectively. The output signal P/E_S of the AND circuit 1031 is further supplied to the gate of the P-channel transistor 809 in the charging circuit 806.

[3-2. Example of Circuit Operation of Selection Circuit Located at Previous Stage when Output Signal is Selected by Selection Circuit Located at Subsequent Stage]

When the output signal OUT1 of the selection circuit 1001 is selected in the selection circuit 305 located at the subsequent stage, the selection control signal SEL_H1 is set to an H level. Accordingly, the AND circuit 1031 in the fourth discharge control unit 1011 receives the selection control signal SEL_H1 of an H level as one input thereof. Therefore, the AND circuit 1031 outputs, as the output signal P/E_S, a signal whose level is the same as that of the timing control signal P/E that is the other input thereof.

Accordingly, the operation of the charging circuit 806 is the same as that of the charging circuit 306 illustrated in FIG. 3. Namely, the charging circuit 806 connects the node N1001 to the voltage source line VDD in a precharge period, and disconnects the node N1001 from the voltage source line VDD in an evaluation period.

Next, the circuit operation of the discharge control circuit 1007 will be described. Since the timing control signal P/E is of an L level in the precharge period, each of the AND circuits 1032 to 1035 in the fourth discharge control unit 1011 receives the timing control signal P/E_S of an L level as one input thereof. Therefore, the AND circuits 1032 to 1035 output the control signals CON_L1 to CON_L4 of L levels, regardless of the levels of the selection control signal SEL_L1 to SEL_L4 that are the other inputs thereof, respectively.

Accordingly, in the transistor array 1012 in the third discharge control unit 1010, the N-channel transistor 1016 is turned off owing to the control signal CON_L1 of an L level. Therefore, a conductive path formed by the transistor array 1012 is put into an electrical non-conduction state, regardless of the level of the input signal IN1. In the same way, also in the other transistor arrays 1013 to 1015, since corresponding transistors are turned off owing to the control signals CON_L2 to CON_L4 of L levels, conductive paths are put into electrical non-conduction states, regardless of the levels of the input signals IN2 to IN4.

Therefore, in the precharge period, the node N1001 is electrically disconnected from the ground line GND, and is charged to an H level by the charging circuit 806.

On the other hand, in the evaluation period, since the timing control signal P/E is of an H level, each of the AND circuits 1032 to 1035 receives the timing control signal P/E_S of an H level, as one input thereof. Accordingly, the AND circuit 1032 to 1035 output signals whose levels are the same as the levels of the selection control signals SEL_L1 to SEL_L4 that are the other inputs thereof, as the control signals CON_L1 to CON_L4, respectively. Therefore, in the third discharge control unit 1010, one of the transistor arrays 1012 to 1015 is selected on the basis of the selection control signals SEL_L1 to SEL_L4.

Accordingly, in the evaluation period, in accordance with the levels of the input signals IN1 to IN4 input to the selected transistor array, the third discharge control unit 1010 controls whether or not the node N1001 that has been charged to an H level is to be discharged to an L level.

As described above, when the output signal of the selection circuit 1001 is selected in the selection circuit located at the subsequent stage, the discharge control operation of the discharge control circuit 1007 for the node N1001 is the same as the discharge control operation of the discharge control circuit 301 for the node N301, illustrated in FIGS. 3 and 4. Accordingly, correlations between the timing control signal P/E, the selection control signals SEL_L1 to SEL_L4, the input signals IN1 to IN4, the node N1001, and the output signal OUT1 in the selection circuit 1001 are the same as those illustrated in the timing chart illustrated in FIG. 5, for example.

At this time, two N-channel transistors included in each transistor array only exist between the node N1001 and the ground line GND, in any one of conductive paths in the transistor arrays 1012 to 1015. On the other hand, for example, in the example illustrated in FIG. 3, since the transistor arrays 312 to 315 and the N-channel transistor 318 exist between the node N301 and the ground line GND, three N-channel transistors turn out to exist.

Consequently, in the selector circuit 1000 according to the third embodiment in FIGS. 10 and 11, when the node N1001 is discharged in the evaluation period, it is possible to reduce the number of transistors through which the discharge current thereof flows, and it is possible to reduce electrical resistance between the node N1001 and the ground line GND. Accordingly, since it is possible to speed up the discharge operation of the node N1001 and it is possible to shorten a time due to the discharge, it is possible to shorten the evaluation period and it is possible to further speed up the circuit operation of the selector circuit.

[3-3. Example of Circuit Operation of Selection Circuit Located at Previous Stage when Output Signal is not Selected by Selection Circuit Located at Subsequent Stage]

When the output signal OUT1 of the selection circuit 1001 is not selected in the selection circuit 305 located at the subsequent stage, the selection control signal SEL_H1 is set to an L level. Accordingly, the AND circuit 1031 in the fourth discharge control unit 1011 receives the selection control signal SEL_H1 of an L level, as one input thereof. Therefore, the AND circuit 1031 constantly outputs a signal of an L level as the output signal P/E_S, regardless of the level of the timing control signal P/E that is the other input thereof.

Accordingly, in response to the output signal P/E_S of an L level, the P-channel transistor 809 in the charging circuit 806 is constantly turned on through the precharge period and the evaluation period.

On the other hand, since each of the ANDs 1032 to 1035 in the fourth discharge control unit 1011 receives the timing control signal P/E_S of an L level as one input thereof, the ANDs 1032 to 1035 constantly output the control signals CON_L1 to CON_L4 of L levels through the precharge period and the evaluation period, regardless of the levels of the selection control signals SEL_L1 to SEL_L4 that are the other inputs thereof, respectively. Accordingly, all conductive paths formed by the transistor arrays 1012 to 1015 in the third discharge control unit 1010 are constantly put into electrical non-conduction states through the precharge period and the evaluation period.

Accordingly, the node N1001 is constantly electrically connected to the voltage source line VDD through the precharge period and the evaluation period, and is constantly electrically disconnected from the ground line GND.

As described above, when the output signal of the selection circuit 1001 is not selected in the selection circuit located at the subsequent stage, the discharge control operation of the discharge control circuit 1007 for the node N1001 is also the same as the discharge control operation of the discharge control circuit 301 for the node N301, illustrated in FIGS. 3 and 4. Accordingly, correlations between the timing control signal P/E, the selection control signals SEL_L1 to SEL_L4, the input signals IN1 to IN4, the node N1001, and the output signal OUT1 in the selection circuit 1001 are the same as those illustrated in the timing chart illustrated in FIG. 6, for example.

According to the above description, when the output signal OUT1 of the selection circuit 1001 is not selected in the selection circuit 305 located at the subsequent stage, no useless consumption current occurs during the circuit operation in the selection circuit 1001, and hence it is possible to useless electric power from being consumed.

In addition, even if the turnoff leak current in each of transistors included in the third discharge control unit 1010 is increased, it is possible to stabilize the potential of the node N1001. Therefore, it is possible to certainly prevent the malfunction of the selector circuit 1000.

4. Fourth Embodiment

Figure 12:
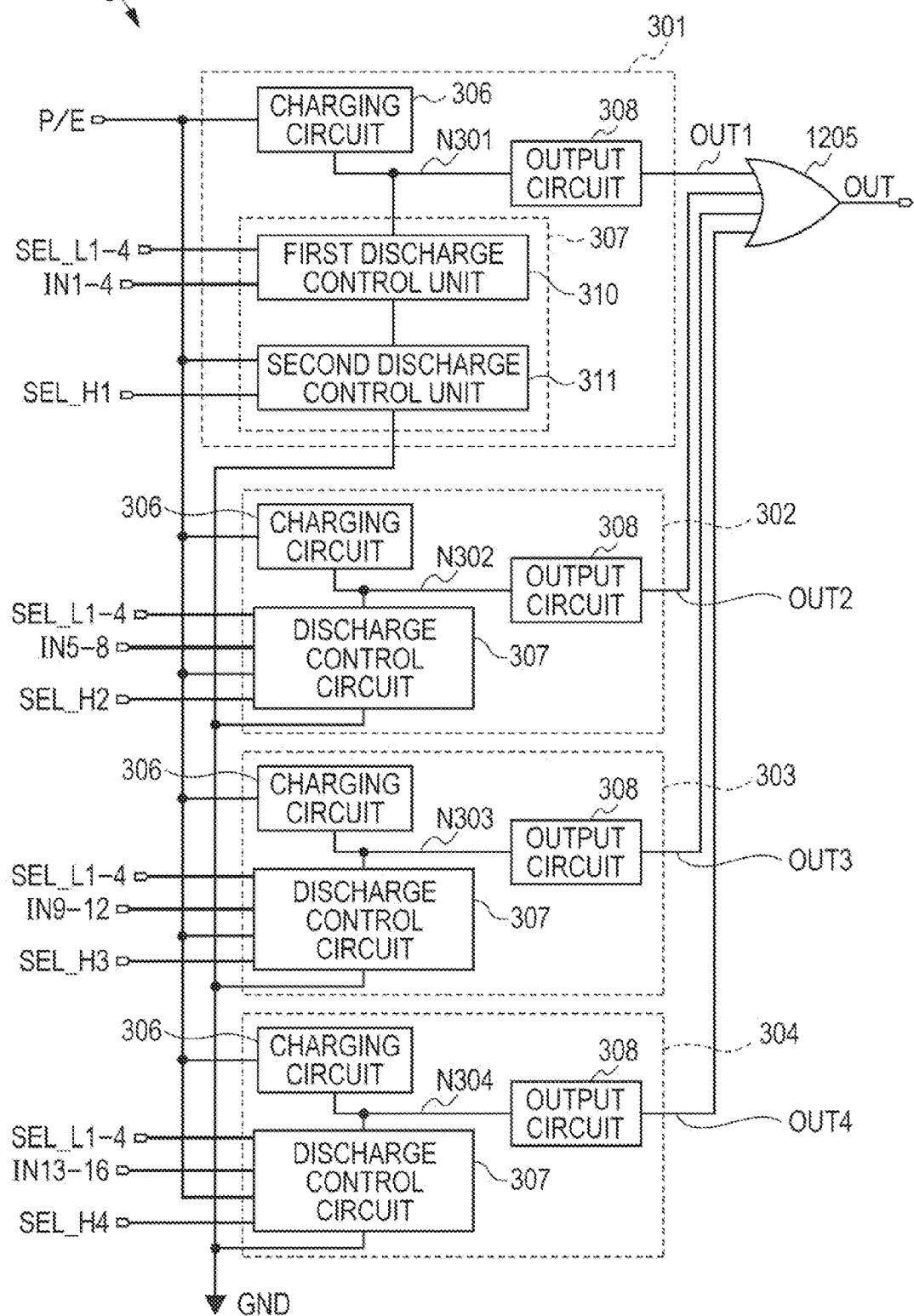
FIG. 12 is a diagram illustrating a selector circuit according to a fourth embodiment.

FIG. 12 is a diagram illustrating a selector circuit according to a fourth embodiment. While a selector circuit 1200 according to the fourth embodiment, illustrated in FIG. 12, differs from the selector circuit 300 according to the first embodiment, illustrated in FIG. 3, in the circuit configuration of a selection circuit located at a subsequent stage, the other portions are the same as those of the selector circuit 300. In FIG. 12, the same symbol is assigned to the same portion as or a portion corresponding to that of the selector circuit 300 illustrated in FIG. 3.

In the selector circuit 1200 illustrated in FIG. 12, an OR circuit 1205 is provided as the selection circuit located at the subsequent stage, which receives the output signals OUT1 to OUT4 of the selection circuits 301 to 304 and outputs an output signal OUT. Each of the selection circuits 301 to 304 located at a previous stage includes the circuit configuration illustrated in FIG. 4, for example.

As described above, in the selection circuits 301 to 304 located at the previous stage, one of the output signals OUT1 to OUT4, which is to be selected in the selection circuit 305 located at the subsequent stage, is specified on the basis of the selection control signals SEL_H1 to SEL_H4. One of the selection circuits located at the previous stage, whose output signal is selected in the selection circuit located at the subsequent stage, performs a selection operation for an input signal, and outputs an output signal whose level corresponds to the level of the selected input signal.

However, the three remaining selection circuits located at the previous stage, whose output signals are not selected in the selection circuit located at the subsequent stage, perform no selection operation, and constantly output output signals having predetermined fixed levels, regardless of the levels of input signals. In the example illustrated in FIG. 12, from among the selection circuits 301 to 304 located at the previous stage, the three selection circuits located at the previous stage, whose output signals are not selected in the selection circuit located at the subsequent stage, constantly output output signals of L levels.

Accordingly, since the OR circuit 1205 receives inputs of L levels from the three selection circuits located at the previous stage, whose output signals are not selected, from among the selection circuit 301 to 304 located at the previous stage, the OR circuit 1205 can receive the output signal from the selection circuit located at the previous stage, whose output signal is selected, and output an output signal having the same level as the level of the output signal. Accordingly, the OR circuit 1205 realizes a function of selecting one of the output signals OUT1 to OUT4 of the selection circuits located at the previous stage and outputting the selected output signal as the output signal OUT.

While usually the logic of an OR circuit can be formed using CMOS circuits, the logical operation circuit thereof is simple, and hence the OR circuit can be realized with a small circuit size. Consequently, it is possible to reduce the circuit size of the whole selector circuit.

In addition, while, in the example illustrated in FIG. 12, a configuration is adopted in which the three selection circuits located at the previous stage, whose output signals are not selected, from among the selection circuits 301 to 304 located at the previous stage, constantly output output signals of L levels, a configuration may also be adopted in which the circuit configuration of the output circuit 308 in each of the selection circuits located at the previous stage is changed and hence the selection circuits located at the previous stage, whose output signals are not selected, constantly output output signals of H levels, for example.

In this case, an AND circuit is utilized in place of the OR circuit, as the selection circuit located at the subsequent stage, and in the same way, it is possible to select one of the output signals OUT1 to OUT4 of the selection circuits located at the previous stage.

5. Fifth Embodiment

Figure 13:
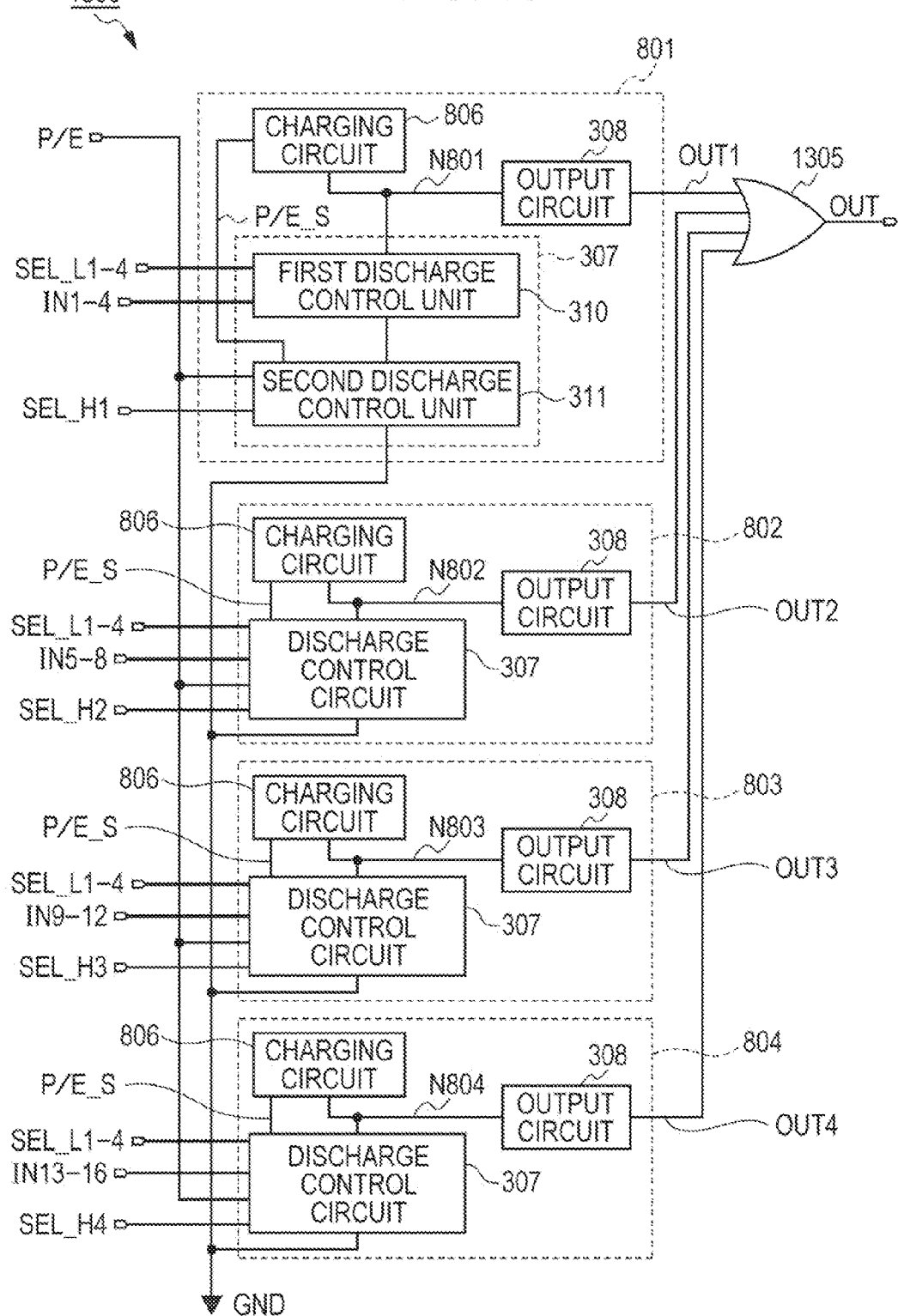
FIG. 13 is a diagram illustrating a selector circuit according to a fifth embodiment.

FIG. 13 is a diagram illustrating a selector circuit according to a fifth embodiment. While a selector circuit 1300 according to the fifth embodiment, illustrated in FIG. 13, differs from the selector circuit 800 according to the second embodiment, illustrated in FIG. 8, in the circuit configuration of a selection circuit located at a subsequent stage, the other portions are the same as those of the selector circuit 800. In FIG. 13, the same symbol is assigned to the same portion as or a portion corresponding to that of the selector circuit 800 illustrated in FIG. 8.

In the selector circuit 1300 illustrated in FIG. 13, an OR circuit 1305 is provided as the selection circuit located at the subsequent stage, which receives the output signals OUT1 to OUT4 of the selection circuits 801 to 804 and outputs an output signal OUT. Each of the selection circuits 801 to 804 located at a previous stage includes the circuit configuration illustrated in FIG. 9, for example. In the same way as the case of the selector circuit 1200 of the fourth embodiment illustrated in FIG. 12, the OR circuit 1305 selects one of the output signals OUT1 to OUT4 of the selection circuits 801 to 804 located at the previous stage and outputs the selected output signal as the output signal OUT.

Usually, an OR circuit can be realized with a small circuit size, using CMOS circuits. Consequently, it is possible to reduce the circuit size of the whole selector circuit.

In addition, a configuration may also be adopted in which the selection circuits located at the previous stage, whose output signals are not selected, constantly output output signals of H levels. In this case, an AND circuit is utilized in place of the OR circuit, as the selection circuit located at the subsequent stage.

6. Sixth Embodiment

Figure 14:
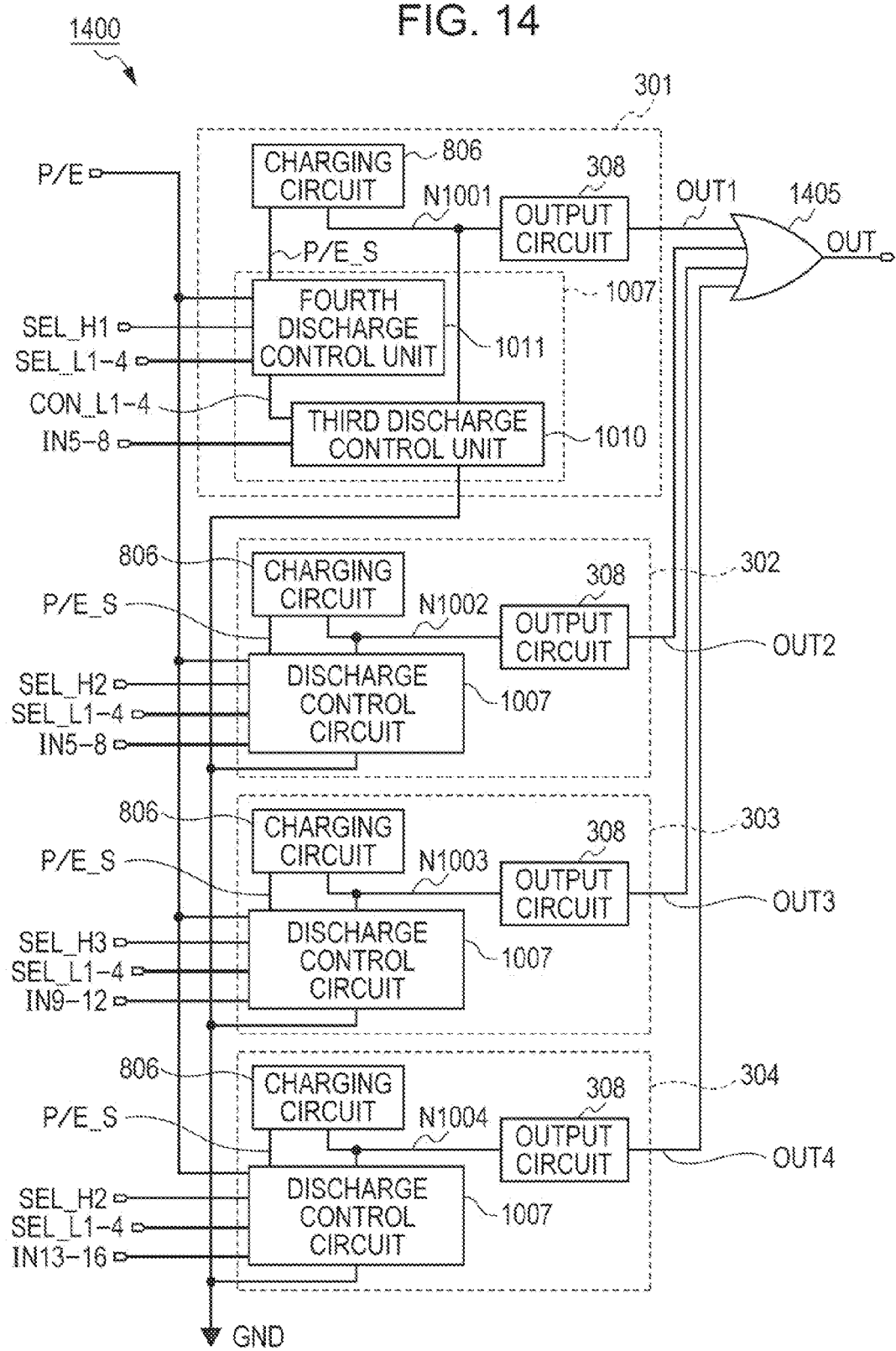
FIG. 14 is a diagram illustrating a selector circuit according to a sixth embodiment.

FIG. 14 is a diagram illustrating a selector circuit according to a sixth embodiment. While a selector circuit 1400 according to the sixth embodiment, illustrated in FIG. 14, differs from the selector circuit 1000 according to the third embodiment, illustrated in FIG. 10, in the circuit configuration of a selection circuit located at a subsequent stage, the other portions are the same as those of the selector circuit 1000. In FIG. 14, the same symbol is assigned to the same portion as or a portion corresponding to that of the selector circuit 1000 illustrated in FIG. 10.

In the selector circuit 1400 illustrated in FIG. 14, an OR circuit 1405 is provided as the selection circuit located at the subsequent stage, which receives the output signals OUT1 to OUT4 of the selection circuits 1001 to 1004 and outputs an output signal OUT. Each of the selection circuits 1001 to 1004 located at a previous stage includes the circuit configuration illustrated in FIG. 11, for example. In the same way as the case of the selector circuit 1200 of the fourth embodiment illustrated in FIG. 12, the OR circuit 1405 selects one of the output signals OUT1 to OUT4 of the selection circuits 1001 to 1004 located at the previous stage and outputs the selected output signal as the output signal OUT.

Usually, an OR circuit can be realized with a small circuit size, using CMOS circuits. Consequently, it is possible to reduce the circuit size of the whole selector circuit.

In addition, a configuration may also be adopted in which the selection circuits located at the previous stage, whose output signals are not selected, constantly output output signals of H levels. In this case, an AND circuit is utilized in place of the OR circuit, as the selection circuit located at the subsequent stage.

7. Seventh Embodiment

Figure 15:
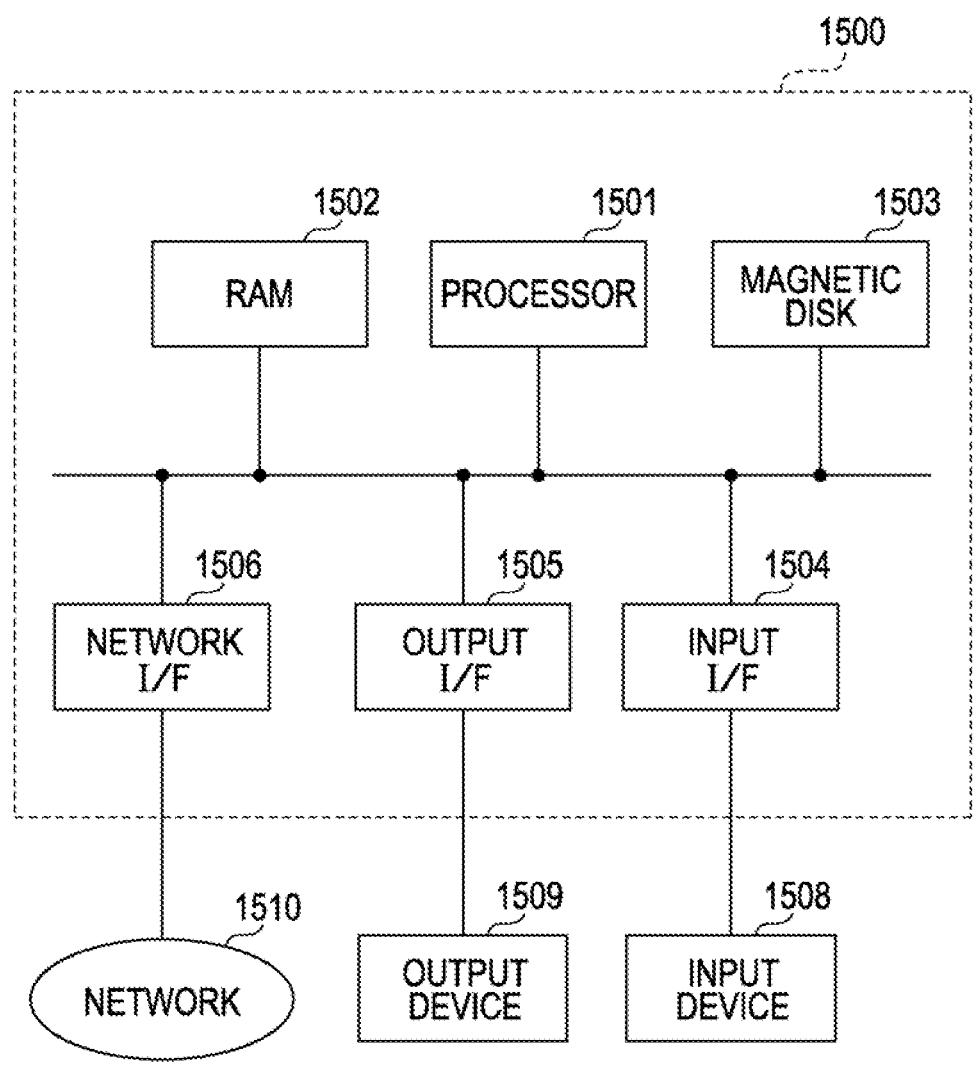
FIG. 15 is a diagram illustrating an example of a processor system according to a seventh embodiment.

FIG. 15 is a diagram illustrating an example of a processor system according to a seventh embodiment. A processor system 1500 illustrated in FIG. 15 includes a processor 1501, a RAM 1502, a magnetic disk 1503, an input interface (hereinafter, referred to as I/F) 1504, an output I/F 1505, a network I/F 1506, and system bus 1507. Individual configuration elements of the system, such as the processor 1501 and the like, are connected to the system bus 1507.

The processor 1501 transmits and receives data to and from the other configuration elements such as the RAM 1502 and the like, and internally performs arithmetic processing for data. The processor 1501 may include a function of controlling the whole system. The detail thereof will be described later.

The RAM 1502 is a memory that stores therein data to be processed by the processor 1501 and stores therein data processed by the processor 1501, for example, the data of an arithmetic processing result. For example, the RAM 1502 is a DRAM. The magnetic disk 1503 stores therein various kinds of data used in the system. For example, the magnetic disk 1503 is a hard disk drive (HDD).

The input I/F 1504 is an interface unit used for connecting to an external input device 1508. For example, the external input device 1508 is a keyboard or a mouse. The output I/F 1505 is an interface unit used for connecting to an external output device 1509. For example, the external output device 1509 is a display. The network I/F 1506 is an interface unit used for connecting to an external network 1510 through various kinds of communication lines. For example, the external network 1510 is a LAN or Internet.

In the system 1500, the above-mentioned individual configuration elements operate in concert with one another, and execute desired processing.

Figure 16:
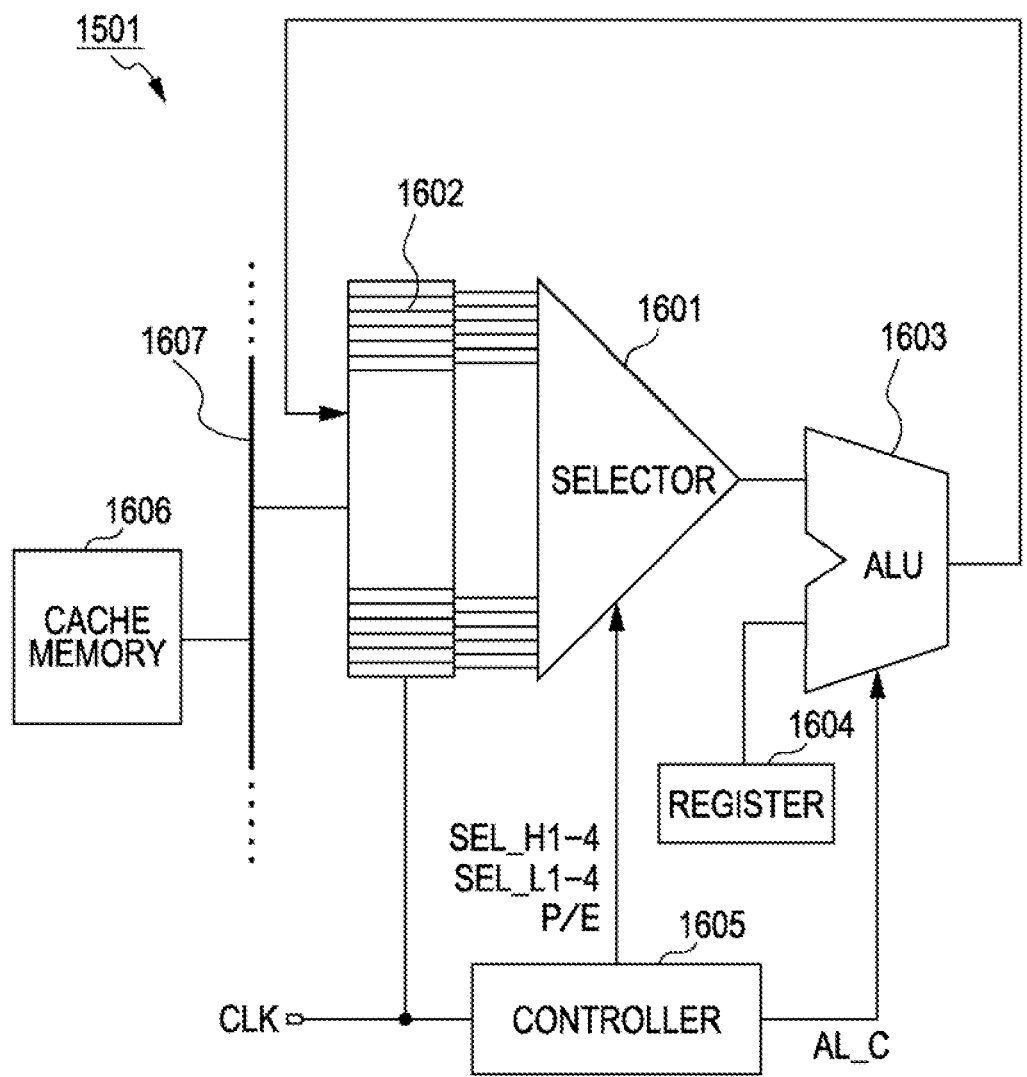
FIG. 16 is a diagram illustrating an example of an internal configuration of a processor according to the seventh embodiment.

Next, the detail of the processor 1501 will be described. FIG. 16 is a diagram illustrating an example of the internal configuration of the processor 1501. The processor 1501 includes a selector 1601, a data register 1602, an ALU 1603, a register 1604, a controller 1605, a cache memory 1606, and a data bus 1607.

The selector 1601 is a circuit that receives a plurality of pieces of input data from the data register 1602, selects one of the plural pieces of input data, and supplies the selected data to one input of the ALU 1603. As the selector 1601, one of the selector circuits 300, 800, 1000, 1200, 1300, and 1400 in individual embodiments illustrated in FIGS. 3, 8, 10, and 12 to 14 is used.

The controller 1605 supplies, to the selector 1601, the selection control signals SEL_H1 to SEL_H4, the selection control signals SEL_L1 to SEL_L4, and the timing control signal P/E, illustrated in FIGS. 3, 8, 10, and 12 to 14. Since the selection operation performed within the selector 1601 is as described above, the description thereof will be omitted. In addition, the internal configuration of the selector 1601 can be arbitrarily changed in accordance with the number of input signals, and the configurations of the signals of the selection control signal SEL_H and the selection control signal SELL may also be arbitrarily changed with the change of the internal configuration of the selector 1601.

The data register 1602 receives a clock signal CLK, and captures and holds an arithmetic processing result of the ALU 1603 in response to the clock signal CLK. In addition, the data register 1602 captures and holds data stored in the cache memory 1606, through the data bus 1607 in response to the clock signal CLK. The data register 1602 holds a plurality of pieces of data in parallel, and supplies the held plural pieces of data to the selector 1601. For example, the data register 1602 corresponds to a plurality of data flip-flop (D-FF) circuits provided in parallel. While, for example, the number of pieces of data the register 1602 holds is 16, the number of pieces of data may be arbitrarily changed in accordance with a utilization form.

The ALU 1603 receives the output data of the selector 1601, as one input thereof, and receives the data held in the register 1604, as the other input thereof. The ALU 1603 is an arithmetic unit that performs desired arithmetic processing such as addition, subtraction, multiplication, or division for the output data of the selector 1601 and the data held in the register 1604, on the basis of a control signal AL_C from the controller 1605. The ALU 1603 outputs the arithmetic processing result to the data register 1602.

The data register 1602, the selector 1601, and the ALU 1603 form a feedback loop, and using the feedback loop, desired arithmetic processing is repeatedly executed in the ALU.

The register 1604 supplies data to the ALU 1603. The arithmetic processing result of another ALU not illustrated is held in the register 1604. In addition, the controller 1605 may set predetermined data in the register 1604.

The controller 1605 receives the clock signal CLK, and, on the basis of the clock signal CLK, generates and supplies the selection control signals SEL_H1 to SEL_H4, the selection control signals SEL_L1 to SEL_L4, and the timing control signal P/E to the selector 1601. On the basis of the clock signal CLK, the controller 1605 adjusts timing at which each of the output data of the data register 1602, the selection control signals SEL_H1 to SEL_H4, the selection control signals SEL_L1 to SEL_L4, and the timing control signal P/E is supplied to the selector 1601. In addition, the controller 1605 supplies, to the ALU 1603, the control signal AL_C indicating which arithmetic processing of addition, subtraction, multiplication, and division the ALU 1603 is to perform.

The cache memory 1606 is connected to the data register 1602 through the data bus 1607. The cache memory 1606 is a memory that inputs and stores therein the arithmetic processing result of the ALU 1603, held in the data register 1602, through the data bus 1607. In addition, the cache memory 1606 stores therein initial data used for the arithmetic processing of the ALU 1603, and supplies the initial data to the data register 1602 through the data bus 1607. For example, the cache memory 1606 is an SRAM.

As described above, in the processor 1501, desired arithmetic processing is repeatedly executed in the ALU 1603, and every time the arithmetic processing is executed, the selector 1601 executes an operation of selecting one from among a plurality of pieces of input data supplied from the data register 1602. Since the selector 1601 executes charge and discharge for a predetermined internal node therein every time the selection operation is executed, the cycle of charge and discharge is repeatedly executed within the selector 1601 every time the arithmetic processing of the ALU 1603 is executed. Therefore, in the processor 1601 and the processor system 1500, the increase of electric power consumption due to the selector 1601 may become a problem.

On the other hand, in the selector 1601 illustrated in FIG. 16, since any one of the selector circuits 300, 800, 1000, 1200, 1300, and 1400 in the individual embodiments illustrated in FIGS. 3, 8, 10, and 12 to 14 is used, it is possible to inhibit internal useless discharge, and it is possible to suppress electric power consumption due to the selector 1601. In particular, since the selection operation of the selector 1601 is a repeatedly executed operation, the degree of the contribution of the reduction of the electric power consumption due to the selector 1601 to the reduction of entire electric power consumption increases when it is intended to reduce electric power consumption in the processor 1601 and the processor system 1500.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A selector circuit comprising:
   a plurality of first selectors, each of the plurality of first selectors being configured to select one of a plurality of input signals on the basis of a first selection control signal and to output a first output signal corresponding to the selected input signal; and a second selector configured to select one of the first output signals outputted from the plurality of first selectors on the basis of a second selection control signal and to output a second output signal corresponding to the selected first output signal, wherein each of the plurality of first selectors includes:

a first node capable of being charged and discharged, a charger configured to be provided between a first voltage source and the first node and to charge the first node by electrically connecting the first node to the first voltage in a first period, the first period being defined by a timing control signal, and a discharge controller configured to be provided between the first node and a second voltage source having a potential lower than the first voltage source and to control, on the basis of the first selection control signal, the plurality of input signals and the second selection control signal, whether to discharge the charged first node by electrically connecting the first node to the second voltage source in a second period, the second period following the first period and being defined by the timing control signal an output circuit configured to output the first output signal having a potential according to a potential of the first node.

2. The selector circuit according to claim 1, wherein the discharge controller included in one of the plurality of first selectors is configured to electrically disconnect the first node from the second voltage source when the second selection control signal indicates that the second selector does not select the first output signal of the one of the plurality of first selectors.

3. The selector circuit according to claim 2, wherein the charger included in the one of the plurality of first selectors is configured to electrically connect the first node to the first voltage source when the second selection control signal indicates that the second selector does not select the first output signal of the one of the plurality of first selectors.

4. The selector circuit according to claim 1, wherein the discharge controller includes:

a first discharge controller configured to select one of the plurality of input signals on the basis of the first selection control signal and control, in accordance with a potential of the selected input signal, whether to electrically connect the first node to the second voltage source, and a second discharge controller configured to control, on the basis of the second selection control signal, whether to electrically connect the first node to the second voltage source in the second period.

5. The selector circuit according to claim 4, wherein the second discharge controller included in one of the plurality of first selectors is configured to electrically disconnect the first node from the second voltage source when the second selection control signal indicates that the second selector does not select the first output signal of the one of the plurality of first selectors.

6. The selector circuit according to claim 1, further comprising:

an output circuit configured to output the first output signal having a potential according to a potential of the first node, wherein the output circuit is configured to hold a potential of the charged first node when the discharge controller does not discharge the charged first node in the second period.

7. The selector circuit according to claim 1, wherein the discharge controller includes:

a third discharge controller configured to select one of the plurality of input signals on the basis of the first selection control signal and to control, in accordance with a potential of the selected input signal, whether to electrically connect the first node to the second voltage source, and a fourth discharge controller configured to control, on the basis of the second selection control signal, whether to provide the first selection control signal for the third discharge controller in the second period.

8. The selector circuit according to claim 7, wherein the fourth discharge controller is configured to control the third discharge controller so that the third discharge controller electrically disconnects the first node from the second voltage source when the fourth discharge controller does not provide the first selection control signal for the third discharge controller.

9. The selector circuit according to claim 7, wherein the fourth discharge controller included in one of the plural first selectors is configured:

controller so that the third discharge controller electrically disconnects the first node from the second voltage source when the second selection control signal indicates that the second selector does not select the first output signal of the one of the plural first selectors, and to provide the first selection control signal to the third discharge controller in the second period when the second selection control signal indicates that the second selector selects the first output signal of the one of the plural first selectors.

10. A selector circuit comprising:

a plurality of first selectors, each of the plurality of first selectors being configured to select one of a plurality of input signals on the basis of a first selection control signal and to output a first output signal corresponding to the selected input signal; and a second selector configured to perform a certain logical operation for the first output signals outputted from the plurality of first selectors and to output a second output signal corresponding to one of the first output signals on the basis of the logical operation, wherein each of the plurality of first selectors is configured to receive a second selection control signal indicating which of the plurality of first output signals the second selector outputs as the second output signal, wherein each of the plurality of first selectors includes:

a first node capable of being charged and discharged, a charger configured to be provided between a first voltage source and the first node and to charge the first node by electrically connecting the first node to the first voltage source in a first period, the first period being defined by a timing control signal, and a discharge controller configured to be provided between the first node and a second voltage source having a potential lower than the first voltage source and to control, on the basis of the first selection control signal, the plurality of input signals, and the second selection control signal, whether to discharge the charged first node by electrically connecting the first node to the second voltage source in a second period, the second period following the first period, specified and being defined by the timing control signal.

11. The selector circuit according to claim 10, wherein the discharge controller included in one of the plurality of first selectors is configured to electrically disconnect the first node from the second voltage source when the second selection control signal indicates that the second selector does not select the first output signal of the one of the plurality of first selectors.

12. The selector circuit according to claim 11, wherein the charger included in the one of the plurality of first selectors is configured to electrically connect the first node to the first voltage source when the second selection control signal indicates that the second selector does not select the first output signal of the one of the plurality of first selectors.

13. The selector circuit according to claim 11, further comprising:
an output circuit configured to output the first output signal having a potential according to a potential of the first node and to hold a potential of the charged first node when the discharge controller does not discharge the charged first node in the second period,
wherein
the output circuit included in the one of the plurality of first selectors is configured to output the first output signal having a certain fixed potential when the second selection control signal indicates that the second selector does not select the first output signal of the one of the plurality of first selectors.

14. The selector circuit according to claim 13, wherein the certain fixed potential is a potential of the second voltage source, and the certain logical operation is logical OR operation.

15. The selector circuit according to claim 10, wherein the discharge controller includes:
a first discharge controller configured to select one of the plurality of input signals on the basis of the first selection control signal and control, in accordance with a potential of the selected input signal, whether to electrically connect the first node to the second voltage source, and
a second discharge controller configured to control, on the basis of the second selection control signal, whether to electrically connect the first node to the second voltage source in the second period.

16. The selector circuit according to claim 10, wherein the discharge controller includes:
a third discharge controller configured to select one of the plurality of input signals on the basis of the first selection control signal and to control, in accordance with a potential of the selected input signal, whether to electrically connect the first node to the second voltage source, and
a fourth discharge configured to control, on the basis of the second selection control signal, whether to provide the first selection control signal for the third discharge controller in the second period.

17. A processor system comprising:
a data register configured to hold a plurality of pieces of data;
a selector configured to receive the pieces of data and to select and output one of the received pieces of data;
an arithmetic unit configured to perform a certain arithmetic processing using the piece of data selected by the selector; and
a controller configured to control a selection operation performed by the selector,
wherein the selector includes
a plurality of first selectors, each of the plurality of first selectors being configured to select one of a plurality of input signals on the basis of a first selection control signal and to output a first output signal corresponding to the selected input signal, and
a second selector configured to perform a certain logical operation for the first output signals outputted from the plurality of first selectors and to output a second output signal corresponding to one of the first output signals on the basis of the logical operation,
wherein each of the plurality of first selectors receives a second selection control signal indicating which of the first output signals the second selector outputs as the second output signal,
wherein each of the plurality of first selectors includes:
a first node capable of being charged and discharged,
a charger configured to be provided between a first voltage source and the first node and to charge the first node by electrically connecting the first node to the first voltage source in a first period, the first period being defined by a timing control signal,
a discharge controller configured to be provided between the first node and a second voltage source having a potential lower than the first voltage source and to control, on the basis of the first selection control signal, the plurality of input signals, and the second selection control signal, whether to discharge the charged first node by electrically connecting the first node to the second voltage source in a second period, the second period following the first period and being defined by the timing control signal, and
an output circuit configured to output the first output signal having a potential according to a potential of the first node and to hold a potential of the charged first node when the discharge controller does not discharge the charged first node in the second period,
wherein the controller generates the first selection control signal, the second selection control signal, and the timing control signal.

18. The processor system according to claim 17, wherein the data register is configured to store data of the result of the arithmetic processing performed by the arithmetic unit and to provide the stored data of the result of the arithmetic processing to the selector.

19. The processor system according to claim 17, wherein the discharge controller included in one of the plurality of first selectors is configured to electrically disconnect the first node from the second voltage source when the second selection control signal indicates that the second selector does not select the first output signal of the one of the plurality of first selectors.

20. The processor system according to claim 19, wherein the charger included in the one of the plurality of first selectors is configured to electrically connect the first node to the first voltage source when the second selection control signal indicates that the second selector does not select the first output signal of the one of the plurality of first selectors.

* * * * *